United States Patent
Li et al.

(10) Patent No.: US 7,768,836 B2
(45) Date of Patent: Aug. 3, 2010

(54) NONVOLATILE MEMORY AND METHOD WITH REDUCED PROGRAM VERIFY BY IGNORING FASTEST AND/OR SLOWEST PROGRAMMING BITS

(75) Inventors: Yan Li, Milpitas, CA (US); Yupin Kawing Fong, Fremont, CA (US); Siu Lung Chan, San Jose, CA (US)

(73) Assignee: Sandisk Corporation, Milpitas, CA (US)

( * ) Notice: Subject to any disclaimer, the term of this patent is extended or adjusted under 35 U.S.C. 154(b) by 103 days.

(21) Appl. No.: 12/249,678

(22) Filed: Oct. 10, 2008

(65) Prior Publication Data

US 2010/0091573 A1    Apr. 15, 2010

(51) Int. Cl.
G11C 11/34    (2006.01)
G11C 16/04    (2006.01)
G11C 16/06    (2006.01)

(52) U.S. Cl. .............. 365/185.22; 365/185.03; 365/185.17; 365/185.19; 365/185.24; 365/185.28

(58) Field of Classification Search ............ 365/185.03, 365/185.17, 185.19, 185.22, 185.24, 185.28
See application file for complete search history.

(56) References Cited

U.S. PATENT DOCUMENTS

| 5,070,032 A | 12/1991 | Yuan et al. |
| 5,095,344 A | 3/1992 | Harari et al. |
| 5,172,338 A | 12/1992 | Mehrotra et al. |
| 5,313,421 A | 5/1994 | Guterman et al. |
| 5,315,541 A | 5/1994 | Harari et al. |
| 5,343,063 A | 8/1994 | Yuan et al. |
| 5,570,315 A | 10/1996 | Tanaka et al. |
| 5,595,924 A | 1/1997 | Yuan et al. |
| 5,661,053 A | 8/1997 | Yuan |

(Continued)

FOREIGN PATENT DOCUMENTS

WO    WO 2004/053882 A1    6/2004

(Continued)

OTHER PUBLICATIONS

Eitan et al., "NROM: A Novel Localized Trapping, 2-Bit Nonvolatile Memory Cell," IEEE Electron Device Letters, vol. 21, No. 11, Nov. 2000, pp. 543-545.

(Continued)

*Primary Examiner*—Ly D Pham
(74) *Attorney, Agent, or Firm*—Davis Wright Tremaine LLP

(57) ABSTRACT

A group of non-volatile memory cells are programmed in a programming pass by a series of incremental programming pulses where each pulse is followed by a program-verify and possibly program-inhibition step. Performance is improved during the programming pass by delayed starting and prematurely terminating the various verify levels that demarcate the multiple memory states. This amounts to skipping the verifying and inhibiting steps of the fastest and slowest programming (fringe) cells of the group. A reference pulse is established when the fastest cells have all been program-verified relative to a first verify level. The starting of what verify level at what pulse will then be delayed relative to the reference pulse. Verifying stops for a given verify level when only a predetermined number of cells remain unverified relative to that given level. Any errors arising from over- or underprogramming of the fringe cells are corrected by an error correction code.

26 Claims, 19 Drawing Sheets

U.S. PATENT DOCUMENTS

| | | | |
|---|---|---|---|
| 5,768,192 | A | 6/1998 | Eitan |
| 5,903,495 | A | 5/1999 | Takeuchi et al. |
| 6,011,725 | A | 1/2000 | Eitan |
| 6,046,935 | A | 4/2000 | Takeuchi et al. |
| 6,185,134 | B1 | 2/2001 | Tanaka |
| 6,222,762 | B1 | 4/2001 | Guterman et al. |
| 7,243,275 | B2 | 7/2007 | Gongwer et al. |
| 7,434,111 | B2 | 10/2008 | Sugiura et al. |
| 7,619,930 | B2 | 11/2009 | Mokhlesi |
| 2006/0140007 | A1 | 6/2006 | Cernea et al. |
| 2007/0025157 | A1* | 2/2007 | Wan et al. ............... 365/185.22 |
| 2007/0263450 | A1 | 11/2007 | Cernea et al. |
| 2008/0127104 | A1* | 5/2008 | Li et al. ...................... 717/126 |
| 2008/0198662 | A1 | 8/2008 | Mokhlesi |

FOREIGN PATENT DOCUMENTS

| | | |
|---|---|---|
| WO | WO 2008/103586 A1 | 8/2008 |

OTHER PUBLICATIONS

EPO/ISA, "Notification of Transmittal of the International Search Report and the Written Opinion of the International Searching Authority, or the Declaration," corresponding International Patent Application No. PCT/US2009/059799, mailed on Dec. 29, 2009, 12 pages.

* cited by examiner

Programming into four states represented by a 2-bit code

Programming into four states represented by a 3-bit code

Conventional Programming with alternating Progam/Verify sequence for a 4-state memory

| Bits/ cell | # of States = Ns | Est. # of Program pulses = Np ~ Ns | Est. # of Program pulse train passes | # of states sensed in each verify = Vs | Est. # of Verify Cycles = Nv = k*Np*Vs |
|---|---|---|---|---|---|
| 1 | 2 | 2 | k | 1 | k*2 |
| 2 | 4 | 4 | k | 3 | k*12 |
| 3 | 8 | 8 | k | 7 | k*56 |
| 4 | 16 | 16 | k | 15 | k*240 |
| ... | ... | ... | ... | ... | ... |
| N | $2^N$ | $2^N$ | k | $2^N - 1$ | $\sim k*2^{2N}$ |

(k ~ 1 to 4)

Estimated number of program pulses and verify cycles to program a page using conventional alternating program/verify algorithm

FIG. 12

Example of the programming characteristics of a population of cells

Example of a Programming Pass with Reduced Verify for a 4-state Memory

NONVOLATILE MEMORY AND METHOD WITH REDUCED PROGRAM VERIFY BY IGNORING FASTEST AND/OR SLOWEST PROGRAMMING BITS

FIELD OF THE INVENTION

This invention relates generally to non-volatile semiconductor memory such as electrically erasable programmable read-only memory (EEPROM) and flash EEPROM, and specifically to memory and programming operations in which the number of verify operations are reduced by ignoring verifying of very fast and very slow programming cells.

BACKGROUND OF THE INVENTION

Solid-state memory capable of nonvolatile storage of charge, particularly in the form of EEPROM and flash EEPROM packaged as a small form factor card, has recently become the storage of choice in a variety of mobile and handheld devices, notably information appliances and consumer electronics products. Unlike RAM (random access memory) that is also solid-state memory, flash memory is non-volatile and retains its stored data even after power is turned off. In spite of the higher cost, flash memory is increasingly being used in mass storage applications. Conventional mass storage, based on rotating magnetic medium such as hard drives and floppy disks, is unsuitable for the mobile and handheld environment. This is because disk drives tend to be bulky, are prone to mechanical failure and have high latency and high power requirements. These undesirable attributes make disk-based storage impractical in most mobile and portable applications. On the other hand, flash memory, both embedded and in the form of a removable card, are ideally suited in the mobile and handheld environment because of its small size, low power consumption, high speed and high reliability features.

EEPROM and electrically programmable read-only memory (EPROM) are non-volatile memory that can be erased and have new data written or "programmed" into their memory cells. Both utilize a floating (unconnected) conductive gate, in a field effect transistor structure, positioned over a channel region in a semiconductor substrate, between source and drain regions. A control gate is then provided over the floating gate. The threshold voltage characteristic of the transistor is controlled by the amount of charge that is retained on the floating gate. That is, for a given level of charge on the floating gate, there is a corresponding voltage (threshold) that must be applied to the control gate before the transistor is turned "on" to permit conduction between its source and drain regions.

The floating gate can hold a range of charges and therefore can be programmed to any threshold voltage level within a threshold voltage window. The size of the threshold voltage window is delimited by the minimum and maximum threshold levels of the device, which in turn correspond to the range of the charges that can be programmed onto the floating gate. The threshold window generally depends on the memory device's characteristics, operating conditions and history. Each distinct, resolvable threshold voltage level range within the window may, in principle, be used to designate a definite memory state of the cell. When the threshold voltage is partitioned into two distinct regions, each memory cell will be able to store one bit of data. Similarly, when the threshold voltage window is partitioned into more than two distinct regions, each memory cell will be able to store more than one bit of data.

In the usual two-state EEPROM cell, at least one current breakpoint level is established so as to partition the conduction window into two regions. When a cell is read by applying predetermined, fixed voltages, its source/drain current is resolved into a memory state by comparing with the breakpoint level (or reference current IREF). If the current read is higher than that of the breakpoint level, the cell is determined to be in one logical state (e.g., a "zero" state). On the other hand, if the current is less than that of the breakpoint level, the cell is determined to be in the other logical state (e.g., a "one" state). Thus, such a two-state cell stores one bit of digital information. A reference current source, which may be externally programmable, is often provided as part of a memory system to generate the breakpoint level current.

In order to increase memory capacity, flash EEPROM devices are being fabricated with higher and higher density as the state of the semiconductor technology advances. Another method for increasing storage capacity is to have each memory cell store more than two states.

For a multi-state or multi-level EEPROM memory cell, the conduction window is partitioned into more than two regions by more than one breakpoint such that each cell is capable of storing more than one bit of data. The information that a given EEPROM array can store is thus increased with the number of states that each cell can store. EEPROM or flash EEPROM with multi-state or multi-level memory cells have been described in U.S. Pat. No. 5,172,338.

The transistor serving as a memory cell is typically programmed to a "programmed" state by one of two mechanisms. In "hot electron injection," a high voltage applied to the drain accelerates electrons across the substrate channel region. At the same time a high voltage applied to the control gate pulls the hot electrons through a thin gate dielectric onto the floating gate. In "tunneling injection," a high voltage is applied to the control gate relative to the substrate. In this way, electrons are pulled from the substrate to the intervening floating gate.

The memory device may be erased by a number of mechanisms. For EPROM, the memory is bulk erasable by removing the charge from the floating gate by ultraviolet radiation. For EEPROM, a memory cell is electrically erasable, by applying a high voltage to the substrate relative to the control gate so as to induce electrons in the floating gate to tunnel through a thin oxide to the substrate channel region (i.e., Fowler-Nordheim tunneling.) Typically, the EEPROM is erasable byte by byte. For flash EEPROM, the memory is electrically erasable either all at once or one or more blocks at a time, where a block may consist of 512 bytes or more of memory.

The memory devices typically comprise one or more memory chips that may be mounted on a card. Each memory chip comprises an array of memory cells supported by peripheral circuits such as decoders and erase, write and read circuits. The more sophisticated memory devices operate with an external memory controller that performs intelligent and higher level memory operations and interfacing.

There are many commercially successful non-volatile solid-state memory devices being used today. These memory devices may be flash EEPROM or may employ other types of nonvolatile memory cells. Examples of flash memory and systems and methods of manufacturing them are given in U.S. Pat. Nos. 5,070,032, 5,095,344, 5,315,541, 5,343,063, and 5,661,053, 5,313,421 and 6,222,762. In particular, flash memory devices with NAND string structures are described in U.S. Pat. Nos. 5,570,315, 5,903,495, 6,046,935. Also nonvolatile memory devices are also manufactured from memory cells with a dielectric layer for storing charge. Instead of the conductive floating gate elements described earlier, a dielectric layer is used. Such memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545. An ONO dielectric layer extends across the channel between source and drain diffusions. The charge for one data bit is localized in the dielectric layer adjacent to the drain, and the charge for the other data bit is localized in the dielectric layer adjacent to the source. For example, U.S. Pat. Nos. 5,768,192 and 6,011,725 disclose a nonvolatile memory cell having a trapping dielectric sandwiched between two silicon dioxide layers. Multi-state data storage is implemented by separately reading the binary states of the spatially separated charge storage regions within the dielectric.

In order to improve read and program performances, multiple charge storage elements or memory transistors in an array are read or programmed in parallel. Thus, a "page" of memory elements are read or programmed together. In existing memory architectures, a row typically contains several interleaved pages or it may constitute one page. All memory elements of a page will be read or programmed together.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate. The process appears non-linear and hence a trial-and-error approach is employed.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify cycle may incur up to 16 sensing operations. Thus, with increasing number of distinguishable state levels in multi-level memory cells ("MLC"), the verify cycle of the program/verify scheme becomes increasingly time-consuming.

U.S. patent application Ser. No. 11/694,992, "DYNAMIC VERIFY BASED ON THRESHOLD VOLTAGE DISTRIBUTION" filed on 31 Mar. 2007 by Nima Mokhlesi and assigned to the same assignee as the present application, discloses a method in which the characteristics of the threshold distribution of the non-volatile memory cells is determined by a soft programming pass. The soft programming pass is performed before the actual programming pass. The soft programming pass programs all cells from their erased state to an intermediate state before the first program state. Once the characteristics of the threshold distribution are determined, the information is used to optimize the program and verify operations in subsequent actual programming passes. The optimization includes ignoring certain fast bits and certain slow bits during the actual programming passes. The errors resulting from ignoring certain bits can be corrected by an error correction code. For example, U.S. Pat. Nos. 6,185,134 and 7,434,111 disclose memory systems that can tolerate some degree of errors. However, the method of U.S. application Ser. No. 11/694,992 calls for a dedicated soft programming pass to discover the characteristics of the threshold distribution, which is in addition to the regular programming pass and therefore necessarily degrades the programming performance.

Therefore there is a general need for high capacity and high performance non-volatile memory. In particular, there is a need to have a high capacity nonvolatile memory with improved programming performance where the aforementioned disadvantage is minimized.

SUMMARY OF INVENTION

A group of non-volatile memory cells are programmed in a programming pass by a series of incremental programming pulses where each pulse is followed by a program-verify and possibly a program-inhibition step. Performance is improved during the programming pass by delayed starting and prematurely terminating the various verify levels that demarcate the multiple memory states. This amounts to skipping the verify and inhibit steps of the fastest and slowest programming (fringe) cells of the group.

Since the programming pass is spanned by the series of pulses, a given pulse represents a given phase in the programming pass. A reference pulse is established and different verify levels are scheduled to be included in the verifying starting at different pulses relative to the reference pulse. The reference pulse is determined when a predetermined number of cells (the fastest cells) have first been program-verified relative to a first verify level. A subsequent verify level will start a certain number of pulses after the reference pulse based on an estimate of how many pulses to program from the first verify level to the subsequent verify level. Since the reference pulse is established after the predetermined number cells have been programmed past the first verify level, this means the fast bits are allowed to get programmed without subjecting them to timely verifying. The effect amounts to ignoring the fast bits and subsequent verify levels are all delayed. Thus the starting of subsequent verify levels at subsequent pulses will then be all delayed when scheduled relative to the reference pulse. This results in a saving in the total number of verifying operations.

Optionally, verifying stops prematurely for a given verify level when only a second predetermined number of cells remain unverified relative to that given level. These remaining unverified cells will be regarded as if verified (pseudo verified). This also results in a saving in the total number of verifying operations.

Any errors arising from over- or under-programming of the fringe cells are corrected by an error correction code. In order to determine how much to delay the starting and how prematurely to terminate the various verify levels, the boundaries of fringe cells in a distribution of the group are identified on-the-fly during the same programming pass used to program the cells to their respective targets. By not verifying the fringe cells, the number of verify steps may be reduced by as much as 30% to 40%.

According to a general aspect of the present invention, as a programming pass alternately programs, verifies and inhibits programming of verified cells in order to program a group of memory cells in parallel to their respective target levels, a threshold distribution of the group is estimated on-the-fly. The estimated distribution allows a predetermined fringe population of fastest and slowest programming bits of the group to be ignored during verifying to save time. This is accomplished by using the estimated distribution to schedule the starting point of each subsequent verify level in order to reduce the total number of verify operations. Any resultant errors resulting from the fringe bits being ignored are correctable by an error correction code ("ECC".)

According to a preferred embodiment of the invention, wherein the threshold voltage of each memory cell is programmable to a value corresponding to a respective target among a set of memory states, a method of programming a group of memory cells in parallel in a programming pass including alternately programming with an incremented pulse and verifying until a predetermined initial number of memory cells have reached a first programmed memory state, wherein at which point a baseline programming pulse level is established and used in the rest of the programming pass to schedule after what additional pulses to begin verifying at which of the verify levels among a set thereof to demarcate between memory states.

According to a preferred embodiment of the invention, wherein the threshold voltage of each memory cell is programmable to a value corresponding to a respective target among a set of memory states, a method of programming a group of memory cells in parallel in a programming pass including alternately programming with an incremented pulse and verifying relative to one or more verify levels, wherein for each verify level relative to which a second predetermined number of cells remain to be verified, the second predetermined number of cells are not verified but treated as if verified relative to that verify level.

In this way, the slowest bits from the distribution of the group of memory cells are not verified and treated as if verified. This results in saving in the verifying. Any errors resulting from these unverified cells are corrected by the error correction code.

According to another aspect of the invention, wherein the threshold voltage of each memory cell is programmable to a value corresponding to a respective target among a set of memory states, a method of programming a group of memory cells in parallel in a programming pass including alternately programming with an incremented pulse and verifying relative to one or more verify levels, wherein for each verify level relative to which a second predetermined number of cells remain to be verified, the second predetermined number of cells are not verified but treated as if verified relative to that verify level. The cell that is treated as if verified is given a predetermined number of additional programming pulses without the intervening verifying or inhibiting steps.

In one preferred embodiment, the predetermined number of additional programming pulses is one. In this way, for these slowest bits which were not verified, an additional pulse will help to program them closer towards their targets.

Additional features and advantages of the present invention will be understood from the following description of its preferred embodiments, which description should be taken in conjunction with the accompanying drawings.

BRIEF DESCRIPTION OF THE DRAWINGS

FIG. 12 is a table illustrating estimated numbers of programming pulses and verifying cycles to program a page using conventional alternating program/verify algorithm.

DETAILED DESCRIPTION OF THE PREFERRED EMBODIMENTS

Memory System

FIG. 1 to FIG. 10 illustrate example memory systems in which the various aspects of the present invention may be implemented.

Figure 11:
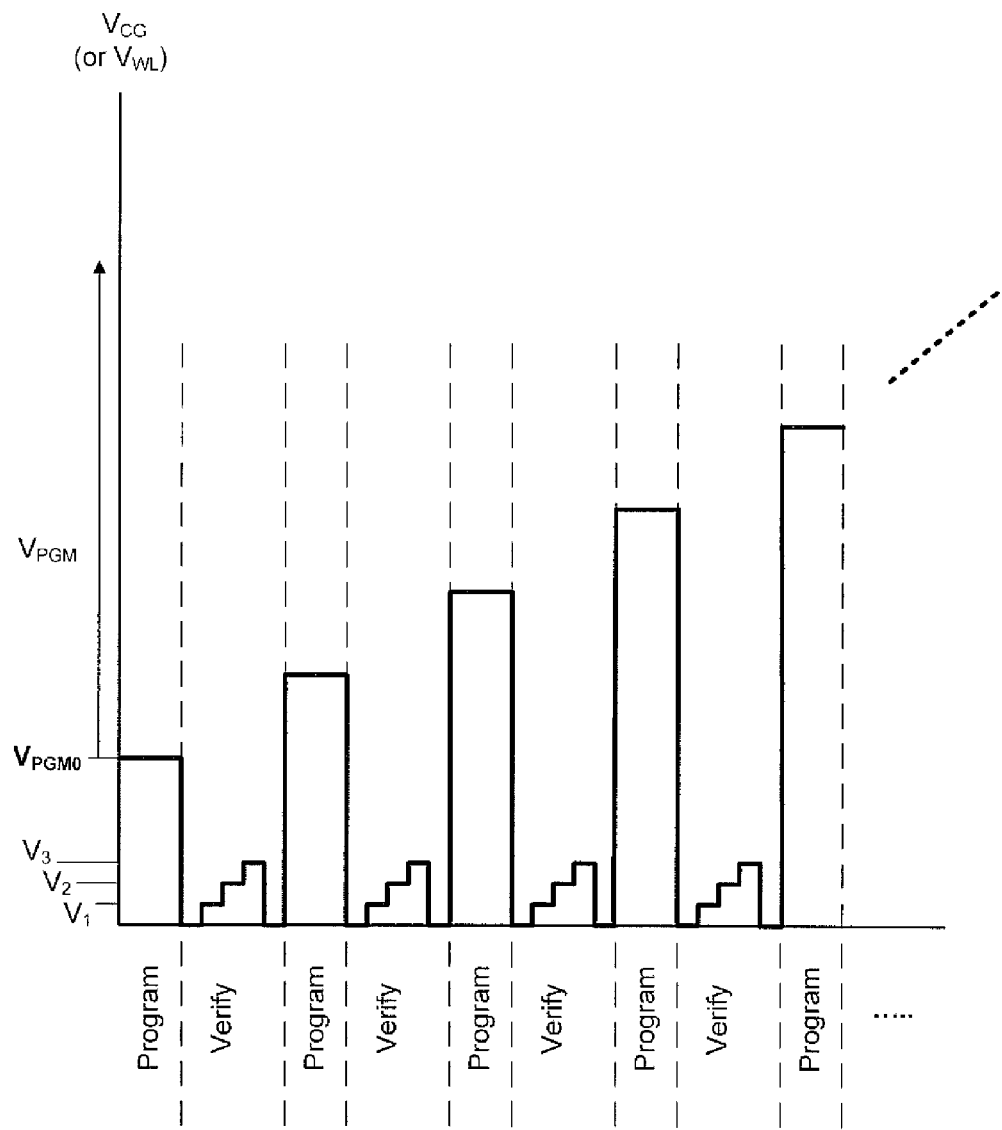
FIG. 11 illustrates a conventional technique for programming a 4-state memory cell to a target memory state.

FIG. 11 and FIG. 12 illustrate a conventional programming technique.

FIG. 13 to FIG. 22 illustrate the context and details of the various aspects and embodiments of the present invention.

Figure 1:
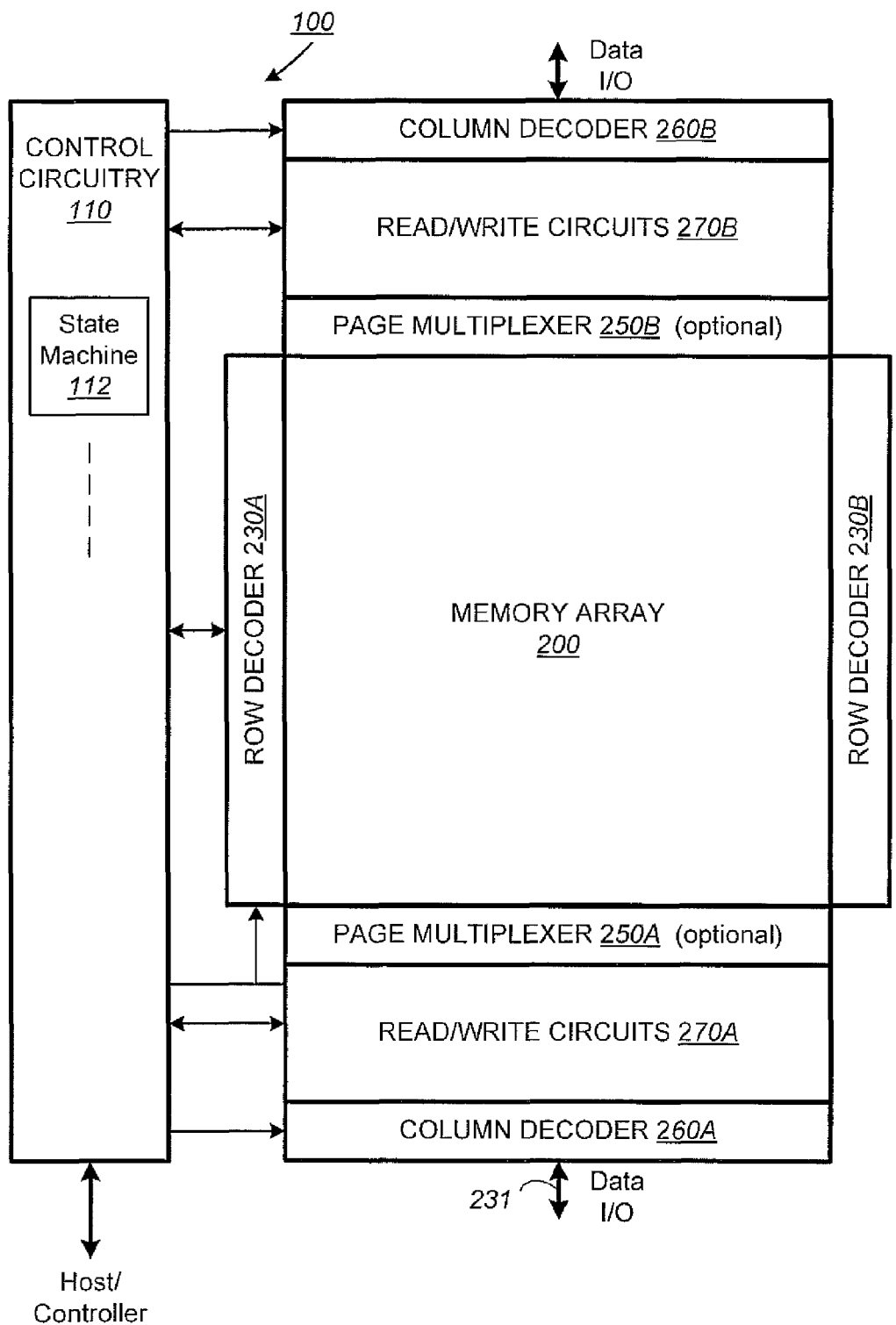
FIG. 1 illustrates schematically the functional blocks of a non-volatile memory chip in which the present invention may be implemented.

FIG. 1 illustrates schematically the functional blocks of a non-volatile memory chip in which the present invention may be implemented. The memory chip 100 includes a two-dimensional array of memory cells 200, control circuitry 210, and peripheral circuits such as decoders, read/write circuits and multiplexers.

Figure 4:
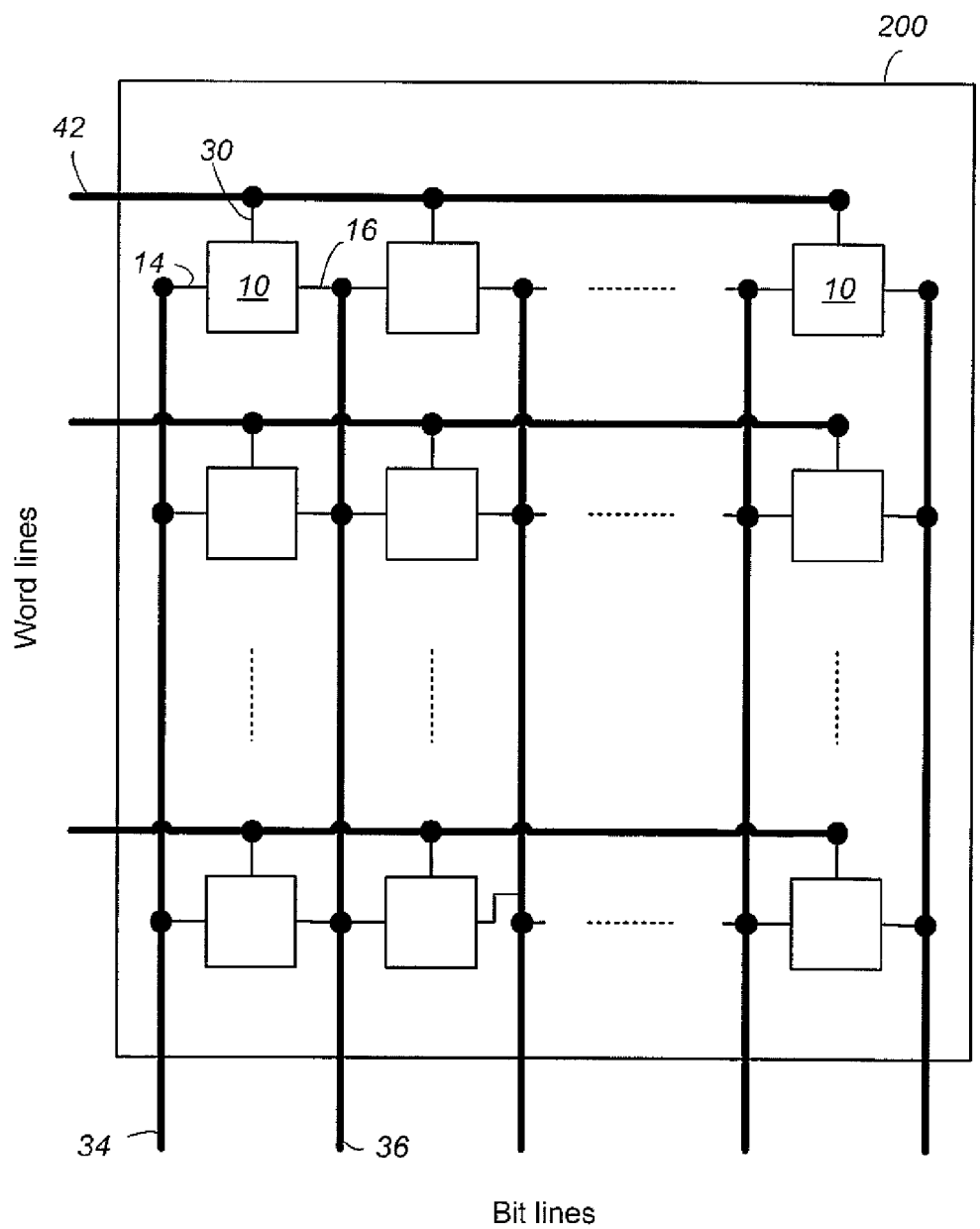
FIG. 4 illustrates an example of an NOR array of memory cells.

The memory array 200 is addressable by word lines via row decoders 230 (split into 230A, 230B) and by bit lines via column decoders 260 (split into 260A, 260B) (see also FIGS. 4 and 5.) The read/write circuits 270 (split into 270A, 270B) allow a page of memory cells to be read or programmed in parallel. A data I/O bus 231 is coupled to the read/write circuits 270.

In a preferred embodiment, a page is constituted from a contiguous row of memory cells sharing the same word line. In another embodiment, where a row of memory cells are partitioned into multiple pages, block multiplexers 250 (split into 250A and 250B) are provided to multiplex the read/write circuits 270 to the individual pages. For example, two pages, respectively formed by odd and even columns of memory cells are multiplexed to the read/write circuits.

FIG. 1 illustrates a preferred arrangement in which access to the memory array 200 by the various peripheral circuits is implemented in a symmetric fashion, on opposite sides of the array so that the densities of access lines and circuitry on each side are reduced in half. Thus, the row decoder is split into row decoders 230A and 230B and the column decoder into column decoders 260A and 260B. In the embodiment where a row of memory cells are partitioned into multiple pages, the page multiplexer 250 is split into page multiplexers 250A and 250B. Similarly, the read/write circuits 270 are split into read/write circuits 270A connecting to bit lines from the bottom and read/write circuits 270B connecting to bit lines from the top of the array 200. In this way, the density of the read/write modules, and therefore that of the sense modules 380, is essentially reduced by one half.

The control circuitry 110 is an on-chip controller that cooperates with the read/write circuits 270 to perform memory operations on the memory array 200. The control circuitry 110 typically includes a state machine 112 and other circuits such as an on-chip address decoder and a power control module (not shown explicitly). The state machine 112 provides chip level control of memory operations. The control circuitry is in communication with a host via an external memory controller.

The memory array 200 is typically organized as a two-dimensional array of memory cells arranged in rows and columns and addressable by word lines and bit lines. The array can be formed according to an NOR type or an NAND type architecture.

Figure 2:
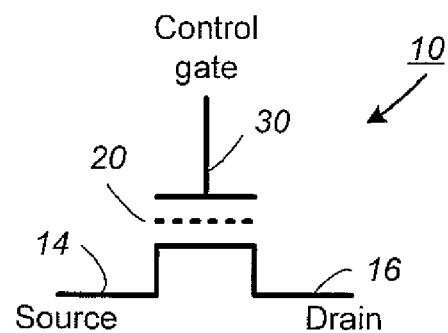
FIG. 2 illustrates schematically a non-volatile memory cell.

FIG. 2 illustrates schematically a non-volatile memory cell. The memory cell 10 can be implemented by a field-effect transistor having a charge storage unit 20, such as a floating gate or a dielectric layer. The memory cell 10 also includes a source 14, a drain 16, and a control gate 30.

There are many commercially successful non-volatile solid-state memory devices being used today. These memory devices may employ different types of memory cells, each type having one or more charge storage element.

Typical non-volatile memory cells include EEPROM and flash EEPROM. Examples of EEPROM cells and methods of manufacturing them are given in U.S. Pat. No. 5,595,924. Examples of flash EEPROM cells, their uses in memory systems and methods of manufacturing them are given in U.S. Pat. Nos. 5,070,032, 5,095,344, 5,315,541, 5,343,063, 5,661, 053, 5,313,421 and 6,222,762. In particular, examples of memory devices with NAND cell structures are described in U.S. Pat. Nos. 5,570,315, 5,903,495, 6,046,935. Also, examples of memory devices utilizing dielectric storage element have been described by Eitan et al., "NROM: A Novel Localized Trapping, 2-Bit Nonvolatile Memory Cell," IEEE Electron Device Letters, vol. 21, no. 11, November 2000, pp. 543-545, and in U.S. Pat. Nos. 5,768,192 and 6,011,725.

In practice, the memory state of a cell is usually read by sensing the conduction current across the source and drain electrodes of the cell when a reference voltage is applied to the control gate. Thus, for each given charge on the floating gate of a cell, a corresponding conduction current with respect to a fixed reference control gate voltage may be detected. Similarly, the range of charge programmable onto the floating gate defines a corresponding threshold voltage window or a corresponding conduction current window.

Alternatively, instead of detecting the conduction current among a partitioned current window, it is possible to set the threshold voltage for a given memory state under test at the control gate and detect if the conduction current is lower or higher than a threshold current. In one implementation the detection of the conduction current relative to a threshold current is accomplished by examining the rate the conduction current is discharging through the capacitance of the bit line.

Figure 3:
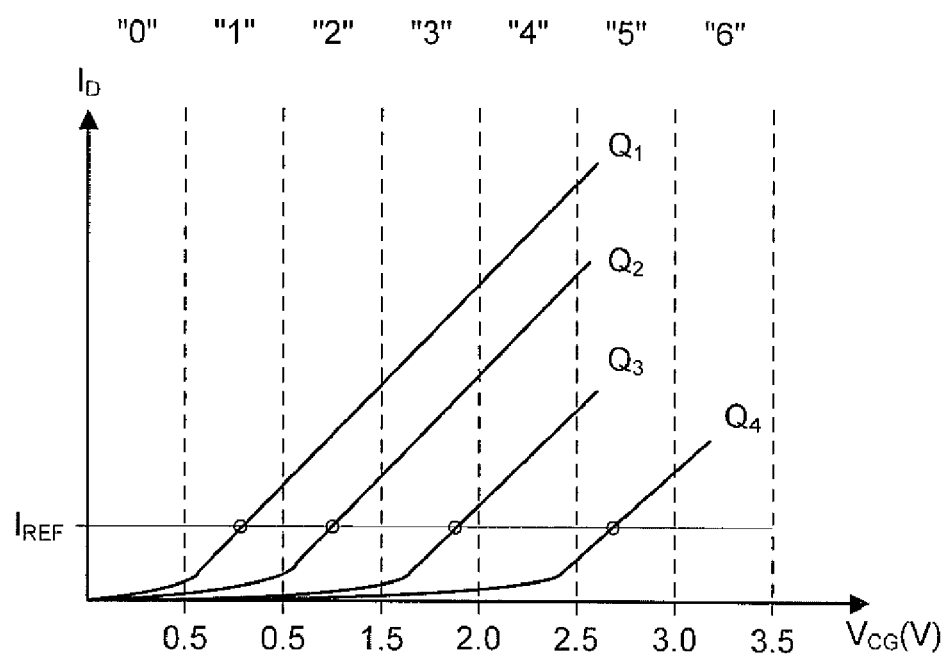
FIG. 3 illustrates the relation between the source-drain current $I_D$ and the control gate voltage $V_{CG}$ for four different charges Q1-Q4 that the floating gate may be selectively storing at any one time.

FIG. 3 illustrates the relation between the source-drain current $I_D$ and the control gate voltage $V_{CG}$ for four different charges Q1-Q4 that the floating gate may be selectively storing at any one time. The four solid $I_D$ versus $V_{CG}$ curves represent four possible charge levels that can be programmed on a floating gate of a memory cell, respectively corresponding to four possible memory states. As an example, the threshold voltage window of a population of cells may range from 0.5V to 3.5V. Seven possible memory states "0", "1", "2", "3", "4", "5", "6", respectively representing one erased and six programmed states may be demarcated by partitioning the threshold window into five regions in interval of 0.5V each. For example, if a reference current, IREF of 2 μA is used as shown, then the cell programmed with Q1 may be considered to be in a memory state "1" since its curve intersects with $I_{REF}$ in the region of the threshold window demarcated by $V_{CG}$=0.5V and 1.0V. Similarly, Q4 is in a memory state "5".

As can be seen from the description above, the more states a memory cell is made to store, the more finely divided is its threshold window. For example, a memory device may have memory cells having a threshold window that ranges from −1.5V to 5V. This provides a maximum width of 6.5V. If the memory cell is to store 16 states, each state may occupy from 200 mV to 300 mV in the threshold window. This will require higher precision in programming and reading operations in order to be able to achieve the required resolution.

FIG. 4 illustrates an example of an NOR array of memory cells. In the memory array 200, each row of memory cells are connected by their sources 14 and drains 16 in a daisy-chain manner. This design is sometimes referred to as a virtual ground design. The cells 10 in a row have their control gates 30 connected to a word line, such as word line 42. The cells in a column have their sources and drains respectively connected to selected bit lines, such as bit lines 34 and 36.

Figure 5A:
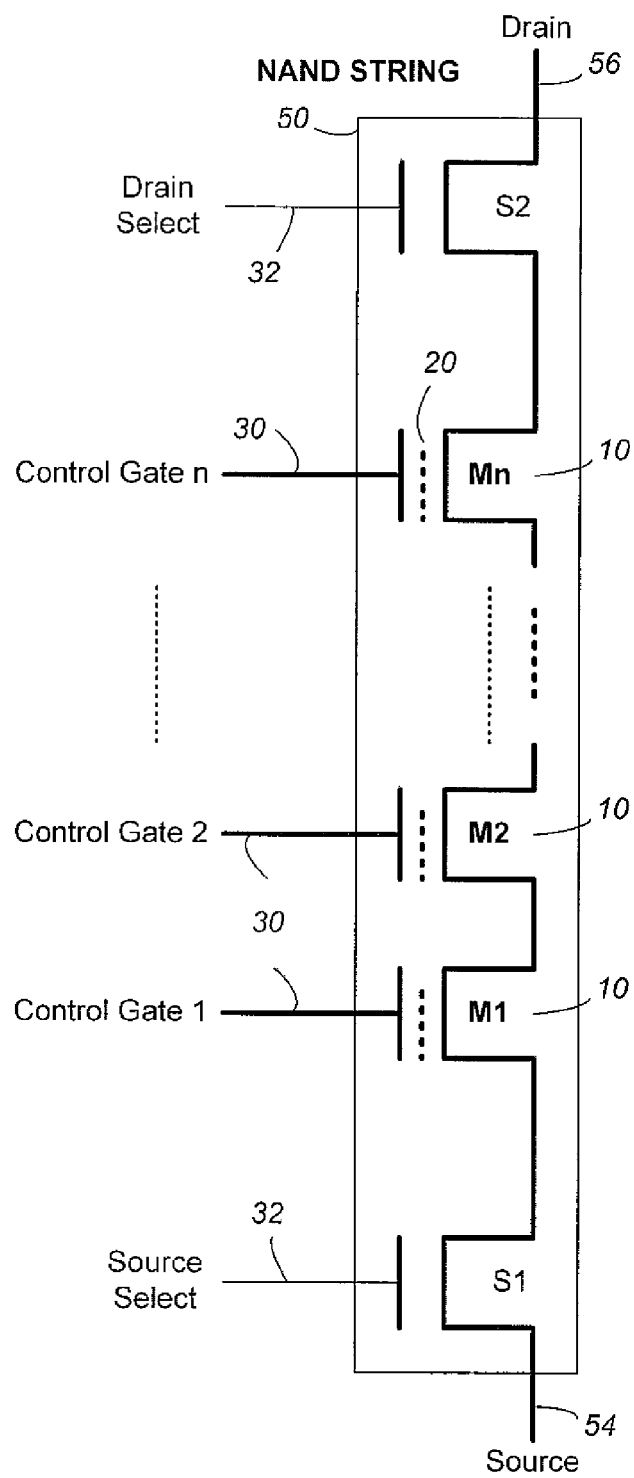
FIG. 5A illustrates schematically a string of memory cells organized into an NAND string.

FIG. 5A illustrates schematically a string of memory cells organized into an NAND string. An NAND string 50 comprises of a series of memory transistors M1, M2, ... Mn (e.g., n=4, 8, 16 or higher) daisy-chained by their sources and drains. A pair of select transistors S1, S2 controls the memory transistors chain's connection to the external via the NAND string's source terminal 54 and drain terminal 56 respectively. In a memory array, when the source select transistor S1 is turned on, the source terminal is coupled to a source line (see FIG. 5B). Similarly, when the drain select transistor S2 is turned on, the drain terminal of the NAND string is coupled to a bit line of the memory array. Each memory transistor 10 in the chain acts as a memory cell. It has a charge storage element 20 to store a given amount of charge so as to represent an intended memory state. A control gate 30 of each memory transistor allows control over read and write operations. As will be seen in FIG. 5B, the control gates 30 of corresponding memory transistors of a row of NAND string are all connected to the same word line. Similarly, a control gate 32 of each of the select transistors S1, S2 provides control access to the NAND string via its source terminal 54 and drain terminal 56 respectively. Likewise, the control gates 32 of corresponding select transistors of a row of NAND string are all connected to the same select line.

When an addressed memory transistor 10 within an NAND string is read or is verified during programming, its control gate 30 is supplied with an appropriate voltage. At the same time, the rest of the non-addressed memory transistors in the NAND string 50 are fully turned on by application of sufficient voltage on their control gates. In this way, a conductive path is effective created from the source of the individual memory transistor to the source terminal 54 of the NAND string and likewise for the drain of the individual memory transistor to the drain terminal 56 of the cell. Memory devices with such NAND string structures are described in U.S. Pat. Nos. 5,570,315, 5,903,495, 6,046,935.

Figure 5B:
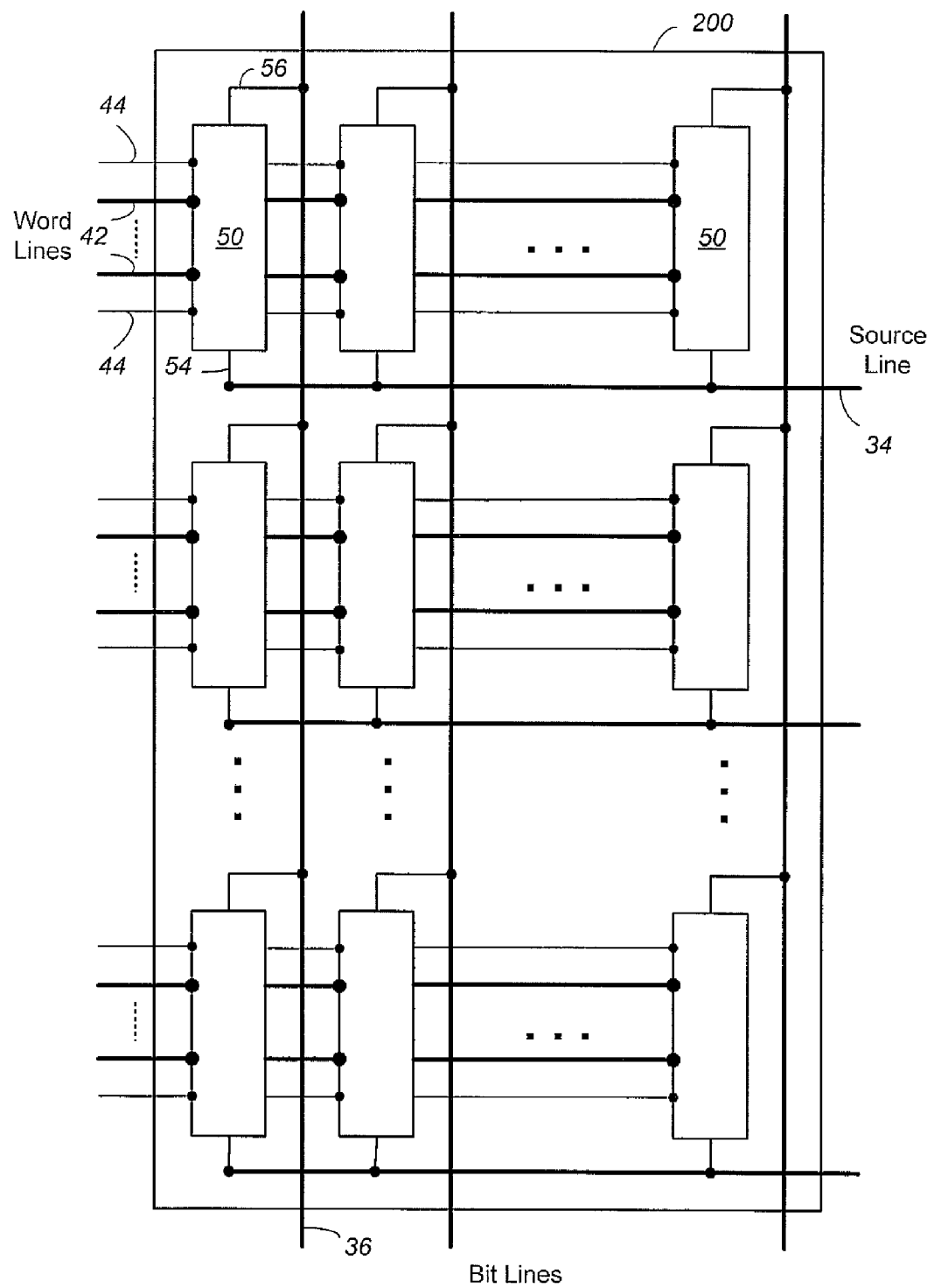
FIG. 5B illustrates an example of an NAND array 200 of memory cells, constituted from NAND strings 50 such as that shown in FIG. 5A.

FIG. 5B illustrates an example of an NAND array 200 of memory cells, constituted from NAND strings 50 such as that shown in FIG. 5A. Along each column of NAND strings, a bit line such as bit line 36 is coupled to the drain terminal 56 of each NAND string. Along each bank of NAND strings, a source line such as source line 34 is couple to the source terminals 54 of each NAND string. Also the control gates along a row of memory cells in a bank of NAND strings are connected to a word line such as word line 42. The control gates along a row of select transistors in a bank of NAND strings are connected to a select line such as select line 44. An entire row of memory cells in a bank of NAND strings can be addressed by appropriate voltages on the word lines and select lines of the bank of NAND strings. When a memory transistor within a NAND string is being read, the remaining memory transistors in the string are turned on hard via their associated word lines so that the current flowing through the string is essentially dependent upon the level of charge stored in the cell being read.

Sensing Circuits and Techniques

Figure 6:
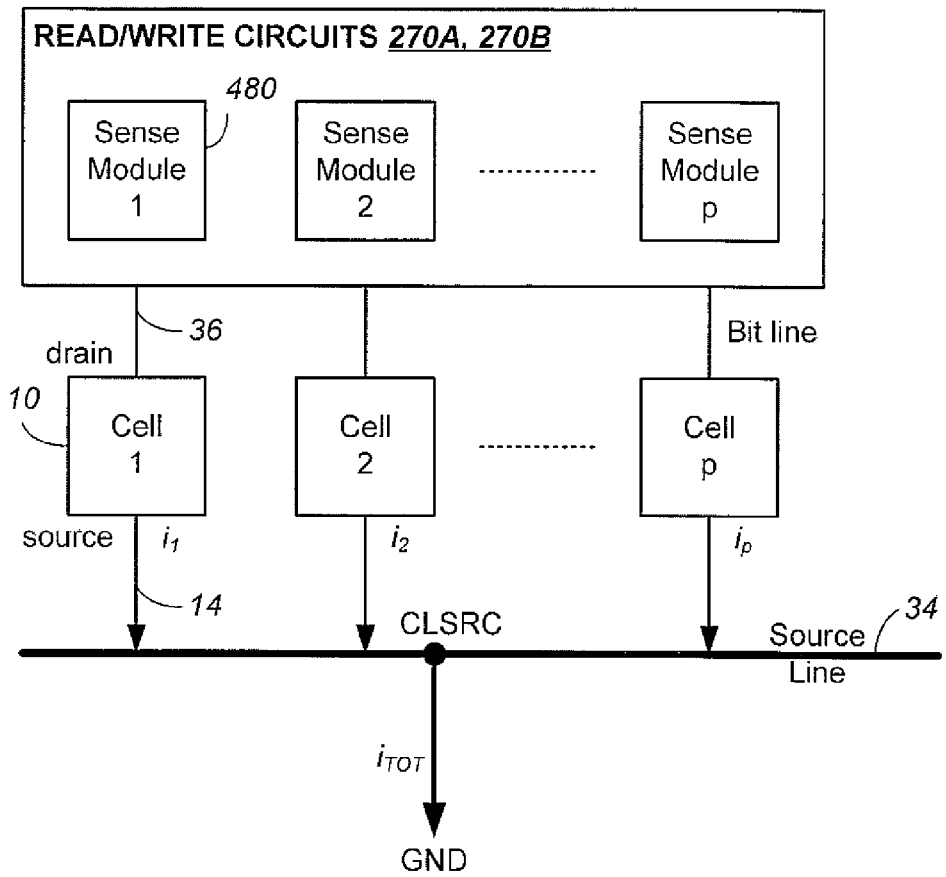
FIG. 6 illustrates the Read/Write Circuits 270A and 270B, shown in FIG. 1, containing a bank of p sense modules across an array of memory cells.

FIG. 6 illustrates the Read/Write Circuits 270A and 270B, shown in FIG. 1, containing a bank of p sense modules across an array of memory cells. The entire bank of p sense modules 480 operating in parallel allows a block (or page) of p cells 10 along a row to be read or programmed in parallel. Essentially, sense module 1 will sense a current $I_1$ in cell 1, sense module 2 will sense a current $I_2$ in cell 2, . . . , sense module p will sense a current $I_p$ in cell p, etc. The total cell current $i_{TOT}$ for the page flowing out of the source line 34 into an aggregate node CLSRC and from there to ground will be a summation of all the currents in the p cells. In conventional memory architecture, a row of memory cells with a common word line forms two or more pages, where the memory cells in a page are read and programmed in parallel. In the case of a row with two pages, one page is accessed by even bit lines and the other page is accessed by odd bit lines. A page of sensing circuits is coupled to either the even bit lines or to the odd bit lines at any one time. In that case, page multiplexers 250A and 250B are provided to multiplex the read/write circuits 270A and 270B respectively to the individual pages.

In currently produced chips based on 56 nm technology p>64000 and in the 43 nm 32 Gbit x4 chip p>150000. In the preferred embodiment, the block is a run of the entire row of cells. This is the so-called "all bit-line" architecture in which the page is constituted from a row of contiguous memory cells coupled respectively to contiguous bit lines. In another embodiment, the block is a subset of cells in the row. For example, the subset of cells could be one half of the entire row or one quarter of the entire row. The subset of cells could be a run of contiguous cells or one every other cell, or one every predetermined number of cells. Each sense module is coupled to a memory cell via a bit line and includes a sense amplifier for sensing the conduction current of a memory cell. In general, if the Read/Write Circuits are distributed on opposite sides of the memory array the bank of p sense modules will be distributed between the two sets of Read/Write Circuits 270A and 270B.

Figure 7:
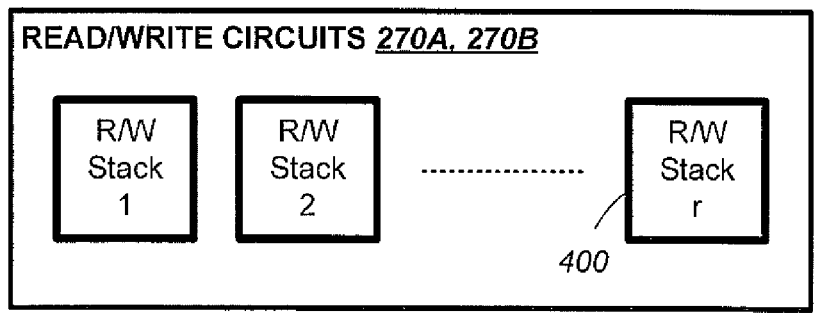
FIG. 7 illustrates schematically a preferred organization of the sense modules shown in FIG. 6.

FIG. 7 illustrates schematically a preferred organization of the sense modules shown in FIG. 6. The read/write circuits 270A and 270B containing p sense modules are grouped into a bank of read/write stacks 400.

Figure 8:
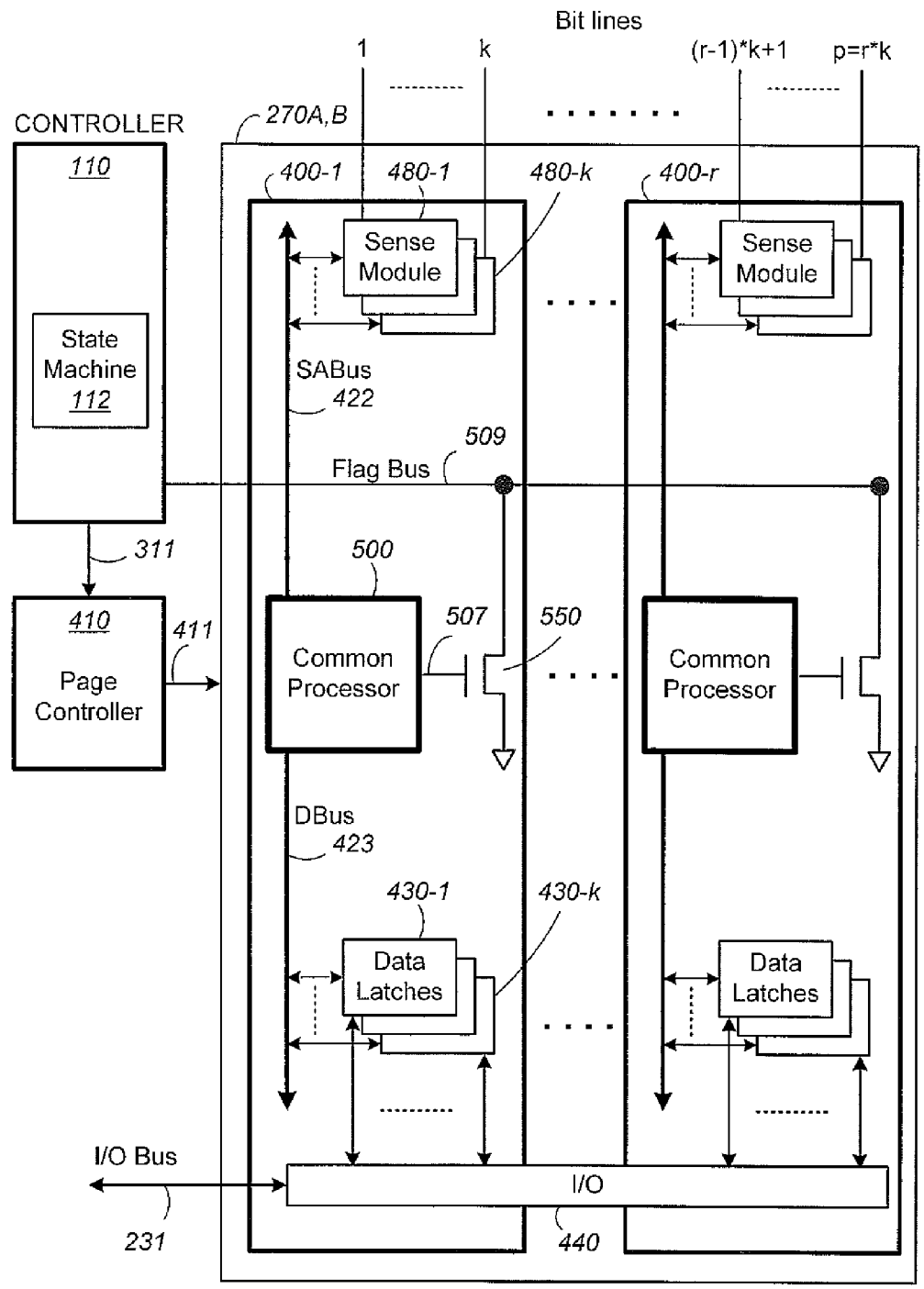
FIG. 8 illustrates in more detail the read/write stacks shown in FIG. 7.

FIG. 8 illustrates in more detail the read/write stacks shown in FIG. 7. Each read/write stack 400 operates on a group of k bit lines in parallel. If a page has p=r*k bit lines, there will be r read/write stacks, 400-1, . . . , 400-r. Essentially, the architecture is such that each stack of k sense modules is serviced by a common processor 500 in order to save space. The common processor 500 computes updated data to be stored in the latches located at the sense modules 480 and at the data latches 430 based on the current values in those latches and on controls from the state machine 112. Detailed description of the common processor has been disclosed in U.S. Patent Application Publication Number: US-2006-0140007-A1 on Jun. 29, 2006, the entire disclosure of which is incorporated herein by reference.

The entire bank of partitioned read/write stacks 400 operating in parallel allows a block (or page) of p cells along a row to be read or programmed in parallel. Thus, there will be p read/write modules for the entire row of cells. As each stack is serving k memory cells, the total number of read/write stacks in the bank is therefore given by r=p/k. For example, if r is the number of stacks in the bank, then p=r*k. One example memory array may have p=150000, k=8, and therefore r=18750.

Each read/write stack, such as 400-1, essentially contains a stack of sense modules 480-1 to 480-k servicing a segment of k memory cells in parallel. The page controller 410 provides control and timing signals to the read/write circuit 370 via lines 411. The page controller is itself dependent on the memory controller 310 via lines 311. Communication among each read/write stack 400 is effected by an interconnecting stack bus 431 and controlled by the page controller 410. Control lines 411 provide control and clock signals from the page controller 410 to the components of the read/write stacks 400-1.

In the preferred arrangement, the stack bus is partitioned into a SABus 422 for communication between the common processor 500 and the stack of sense modules 480, and a DBus 423 for communication between the processor and the stack of data latches 430.

The stack of data latches 430 comprises of data latches 430-1 to 430-k, one for each memory cell associated with the stack The I/O module 440 enables the data latches to exchange data with the external via an I/O bus 231.

The common processor also includes an output 507 for output of a status signal indicating a status of the memory operation, such as an error condition. The status signal is used to drive the gate of an n-transistor 550 that is tied to a FLAG BUS 509 in a Wired-Or configuration. The FLAG BUS is preferably precharged by the controller 310 and will be pulled down when a status signal is asserted by any of the read/write stacks.

Examples of Multi-State Memory Partitioning

A nonvolatile memory in which the memory cells each stores multiple bits of data has already been described in connection with FIG. 3. A particular example is a memory formed from an array of field-effect transistors, each having a charge storage layer between its channel region and its control gate. The charge storage layer or unit can store a range of charges, giving rise to a range of threshold voltages for each field-effect transistor. The range of possible threshold voltages spans a threshold window. When the threshold window is partitioned into multiple sub-ranges or zones of threshold voltages, each resolvable zone is used to represent a different memory states for a memory cell. The multiple memory states can be coded by one or more binary bits. For example, a memory cell partitioned into four zones can support four states which can be coded as 2-bit data. Similarly, a memory cell partitioned into eight zones can support eight memory states which can be coded as 3-bit data, etc.

Figure 9:
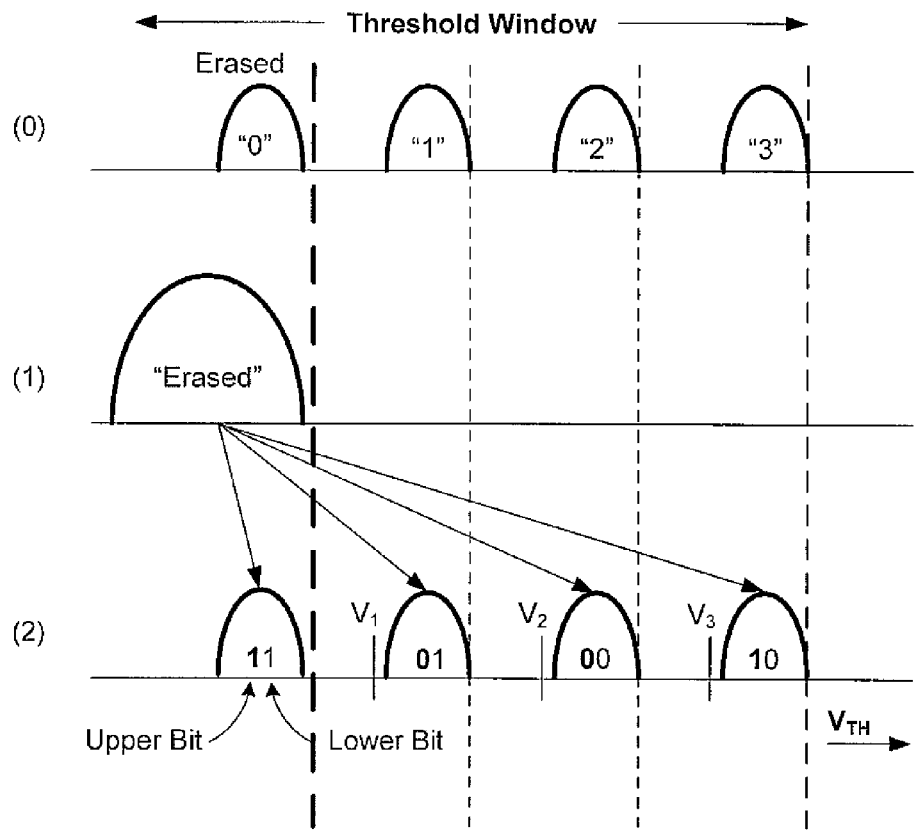
FIG. 9(0)-9(2) illustrate an example of programming a population of 4-state memory cells.

FIG. 9(0)-9(2) illustrate an example of programming a population of 4-state memory cells. FIG. 9(0) illustrates the population of memory cells programmable into four distinct distributions of threshold voltages respectively representing memory states "0", "1", "2" and "3". FIG. 9(1) illustrates the initial distribution of "erased" threshold voltages for an erased memory. FIG. 9(2) illustrates an example of the memory after many of the memory cells have been programmed. Essentially, a cell initially has an "erased" threshold voltage and programming will move it to a higher value into one of the three zones demarcated by $V_1$, $V_2$ and $V_3$. In this way, each memory cell can be programmed to one of the three programmed state "1", "2" and "3" or remain un-programmed in the "erased" state. As the memory gets more programming, the initial distribution of the "erased" state as shown in FIG. 9(1) will become narrower and the erased state is represented by the "0" state.

A 2-bit code having a lower bit and an upper bit can be used to represent each of the four memory states. For example, the "0", "1", "2" and "3" states are respectively represented by "11", "01", "00" and '10". The 2-bit data may be read from the memory by sensing in "full-sequence" mode where the two bits are sensed together by sensing relative to the read demarcation threshold values $V_1$, $V_2$ and $V_3$ in three sub-passes respectively.

Figure 10:
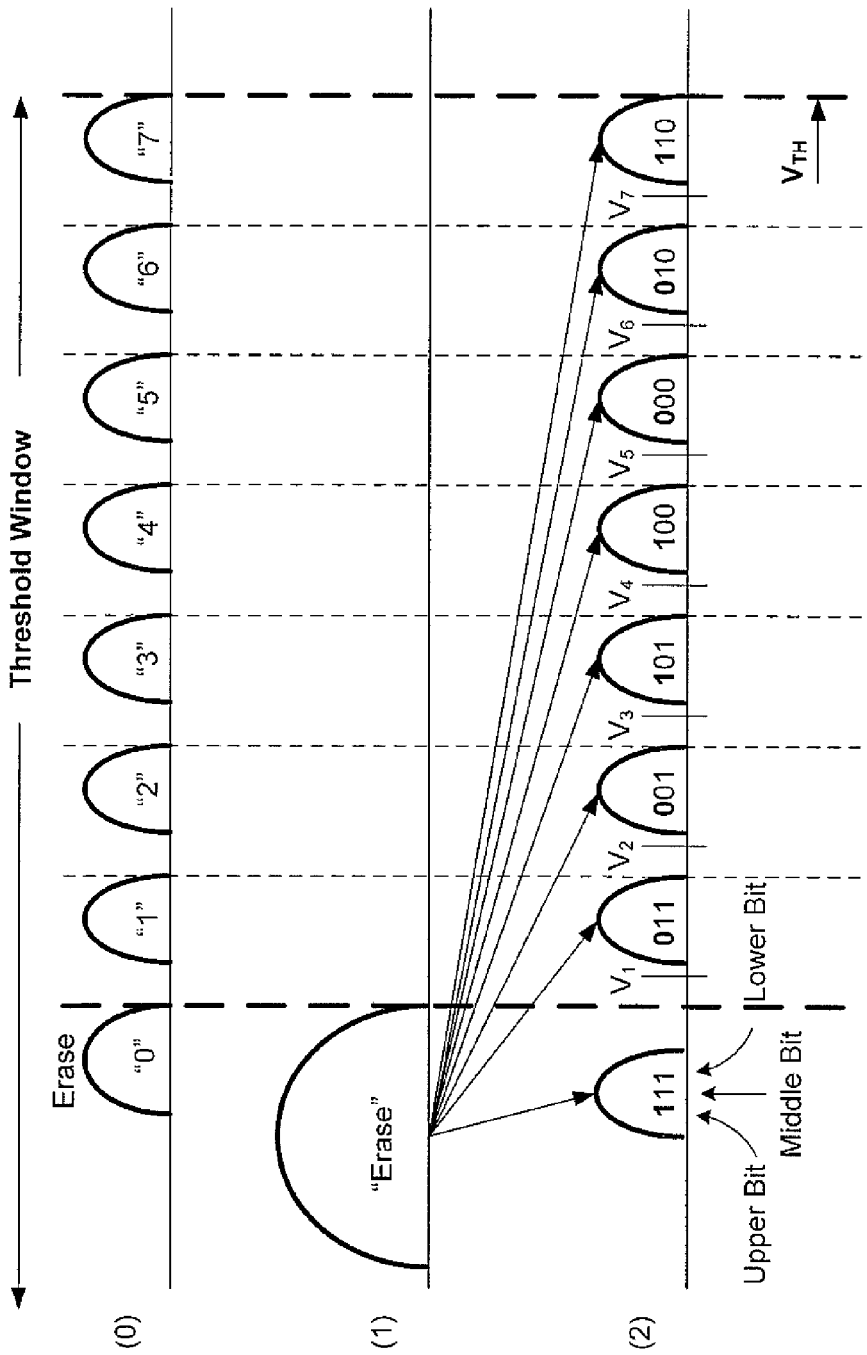
FIG. 10(0)-10(2) illustrate an example of programming a population of 8-state memory cells.

FIG. 10(0)-10(2) illustrate an example of programming a population of 8-state memory cells. FIG. 10(0) illustrates the population of memory cells programmable into eight distinct distributions of threshold voltages respectively representing memory states "0"-"7". FIG. 10(1) illustrates the initial distribution of "erased" threshold voltages for an erased memory. FIG. 10(2) illustrates an example of the memory after many of the memory cells have been programmed. Essentially, a cell initially has an "erased" threshold voltage and programming will move it to a higher value into one of the three zones demarcated by $V_1$-$V_7$. In this way, each memory cell can be programmed to one of the seven programmed state "1"-"7" or remain un-programmed in the "erased" state. As the memory gets more programming, the initial distribution of the "erased" state as shown in FIG. 10(1) will become narrower and the erased state is represented by the "0" state.

A 3-bit code having a lower bit and an upper bit can be used to represent each of the four memory states. For example, the "0", "1", "2", "3", "4", "5", "6" and "7" states are respectively represented by "111", "011", "001", "101', "100", "000", "010" and '110". The 3-bit data may be read from the memory by sensing in "full-sequence" mode where the three bits are sensed together by sensing relative to the read demarcation threshold values $V_1$-$V_7$ in seven sub-passes respectively.

Page or Word-Line Programming and Verify

One method of programming a page is full-sequence programming. All cells of the page are initially in an erased state. Thus, all cells of the page are programmed in parallel from the erased state towards their target states. Those memory cells with "1" state as a target state will be prohibited from further programming once their have been programmed to the "1" state while other memory cells with target states "2" or higher will be subject to further programming. Eventually, the memory cells with "2" as a target state will also be locked out from further programming. Similarly, with progressive programming pulses the cells with target states "3"-"7" are reached and locked out.

Since a verifying take place after a programming pulse and each verifying may be relative to a number of verify levels, various "smart" verifying schemes have been implemented to reduce the total number of verifying operations. For example, since the pulse by pulse programming increasing programs the population of cells towards higher and higher threshold levels, verifying relative to a higher verify level needs not start until a certain pulse. An example of a programming technique with smart verify is disclosed in U.S. Pat. No. 7,243,275, "SMART VERIFY FOR MULTI-STATE MEMORIES" by Gongwer et al., issued 10 Jul. 2007, and assigned to the same assignee as the present application. The entire disclosure of U.S. Pat. No. 7,243,275 is incorporated herein by reference.

FIG. 11 illustrates a conventional technique for programming a 4-state memory cell to a target memory state. Programming circuits generally apply a series of programming pulses to a selected word line. In this way, a page of memory cells whose control gates are coupled to the word line can be programmed together. The programming pulse train used may have increasing period or amplitude in order to counteract the accumulating electrons programmed into the charge storage unit of the memory cell. A programming voltage $V_{PGM}$ is applied to the word line of a page under programming. The programming voltage $V_{PGM}$ is a series of programming voltage pulses in the form of a staircase waveform starting from an initial voltage level, $V_{PGM0}$. Each cell of the page under programming is subject to this series of programming voltage pulses, with an attempt at each pulse to add incremental charges to the charge storage element of the cell. In between programming pulses, the cell is read back to determine its threshold voltage. The read back process may involve one or more sensing operation. Programming stops for the cell when its threshold voltage has been verified to fall within the threshold voltage zone corresponding to the target state. Whenever a memory cell of the page has been programmed to its target state, it is program-inhibited while the other cells continue to be subject to programming until all cells of the page have been program-verified.

The conventional programming technique of using a series of alternating program/verify cycles is to deal with the uncertainty in the programming process in which the cell's threshold voltage grows fast initially in response to a relatively large change in $V_{PGM}$. However, the growth slows down and eventually stops as charges programmed into the floating gate act as a shield to diminish the effective electric field for further tunneling of the electrons into the floating gate.

The disadvantage of the program/verify programming technique is that the verify cycle takes up time and impacts performance. The problem is exacerbated by the implementation of memory cells capable of storing multiple bits. Essentially verify needs to be performed for each of the possible multiple states of a memory cell. For a memory with 16 possible memory states, this means each verify step would incur at least 16 sensing operations. In some other schemes it could even be a few times more. Thus, with the partitioning of a memory into increasing number of states, the verify cycle of the program/verify scheme becomes increasingly time-consuming.

FIG. 12 is a table illustrating estimated numbers of programming pulses and verifying cycles to program a page using conventional alternating program/verify algorithm. For example, for an N-bit memory, the partitioning is into $Ns=2^N$ states. The number of program pulses is at least the same of the number of states Ns. Some algorithm may require k programming passes, where k may be 1 to 4.) For multi-state memory, each verify operation is further multiplied by $2^N-1$, one for each programmed state. Thus, the estimated number of verified is proportional to $2^{2N}$, which is the square of the number of states. As can be seen from the table, for a 3-bit cell, the nominal number of verify cycles is already extremely high, and that is not including additional sensing required in other schemes. For 4-bit cell, the number of verify cycle is prohibitive.

Thus, there is a need for a memory device with improved programming performance where the number of verify cycles is reduced.

Programming with Reduced Verify while Ignoring the Fastest and the Slowest Bits

Figure 13:
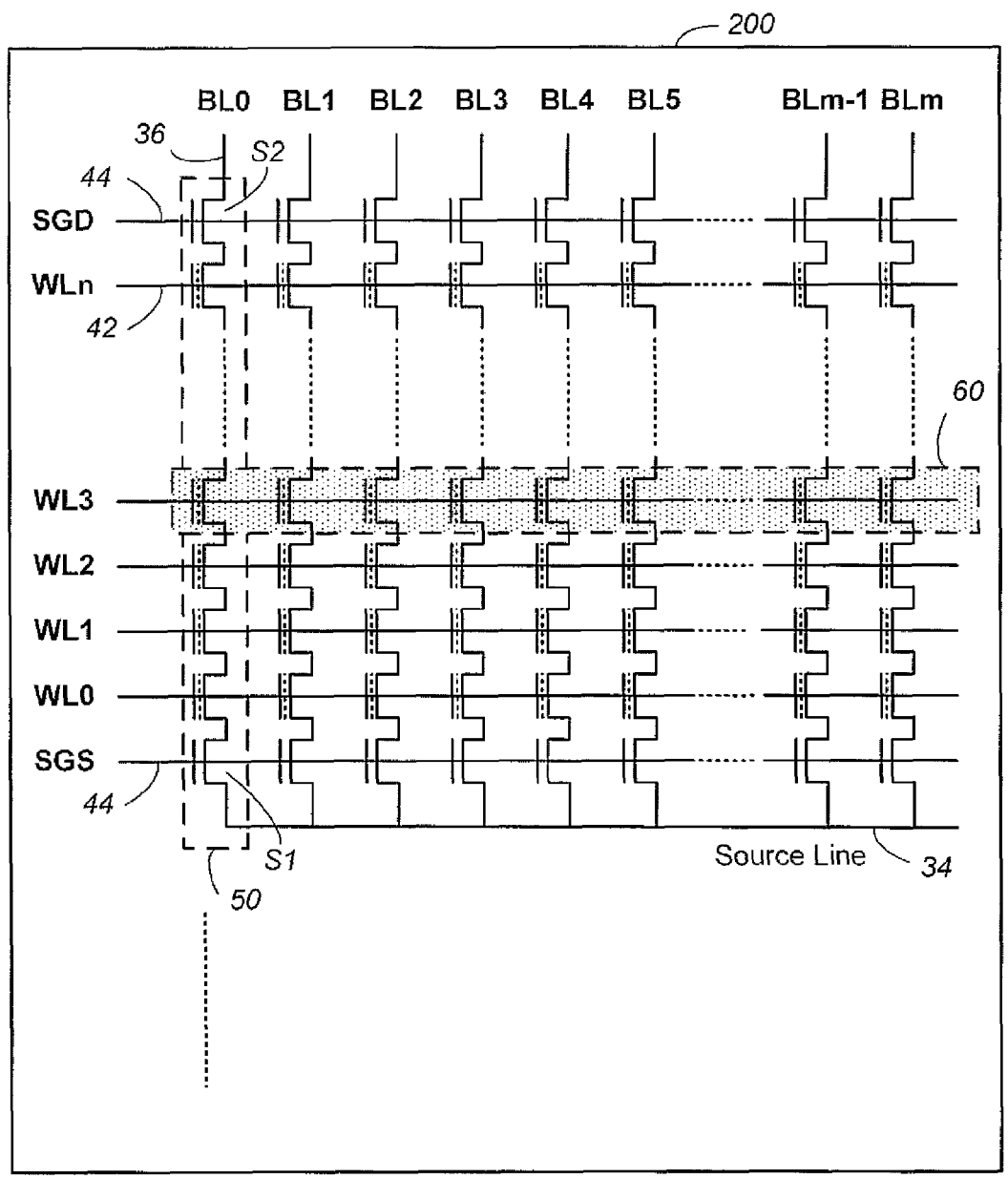
FIG. 13 illustrates an example of a page of NAND-type memory cells being programmed in parallel.

FIG. 13 illustrates an example of a page of NAND-type memory cells being programmed in parallel. It essentially shows a bank of NAND strings 50 from the memory array 200 of FIG. 5B, where the detail of each NAND string is shown explicitly as in FIG. 5A. A "page" such as a page 60, is a group of memory cells programmable in parallel. The page of cells have their control gates connected in common to a word line 42 and each cell of the page accessible by a sensing circuit (e.g., sense module 480 shown in FIG. 8) via a bit line such as bit line 36. In the current generation of memory devices, a page can be as large as 16 k cells. When programming the page of cells 60, a programming voltage is applied to the common word line WL3. The programming is metered pulse by pulse, with a verifying step after each pulse to determine the threshold level of each cell relative to a verify level. For multi-level memory devices, the verifying would be relative to one or more of the verify levels demarcating between different memory states.

Prior to programming, those cells that have already been programmed to their target states are program-inhibited. This is achieved by effectively reducing the voltage difference between the control gate and the channel region of the cell in order to discourage electrons from tunneling from the source to the floating gate (see FIG. 2.) As is well know for NAND type memories, this is accomplished by setting the associated bit line to a voltage (e.g., Vcc) that causes the drain select transistor to turn off, thereby floating the channel regions of the NAND strings in the column of the associated bit line. On the other hand, the columns where the NAND strings are enabled for programming, the associated bit lines are set to 0V.

Figure 14:
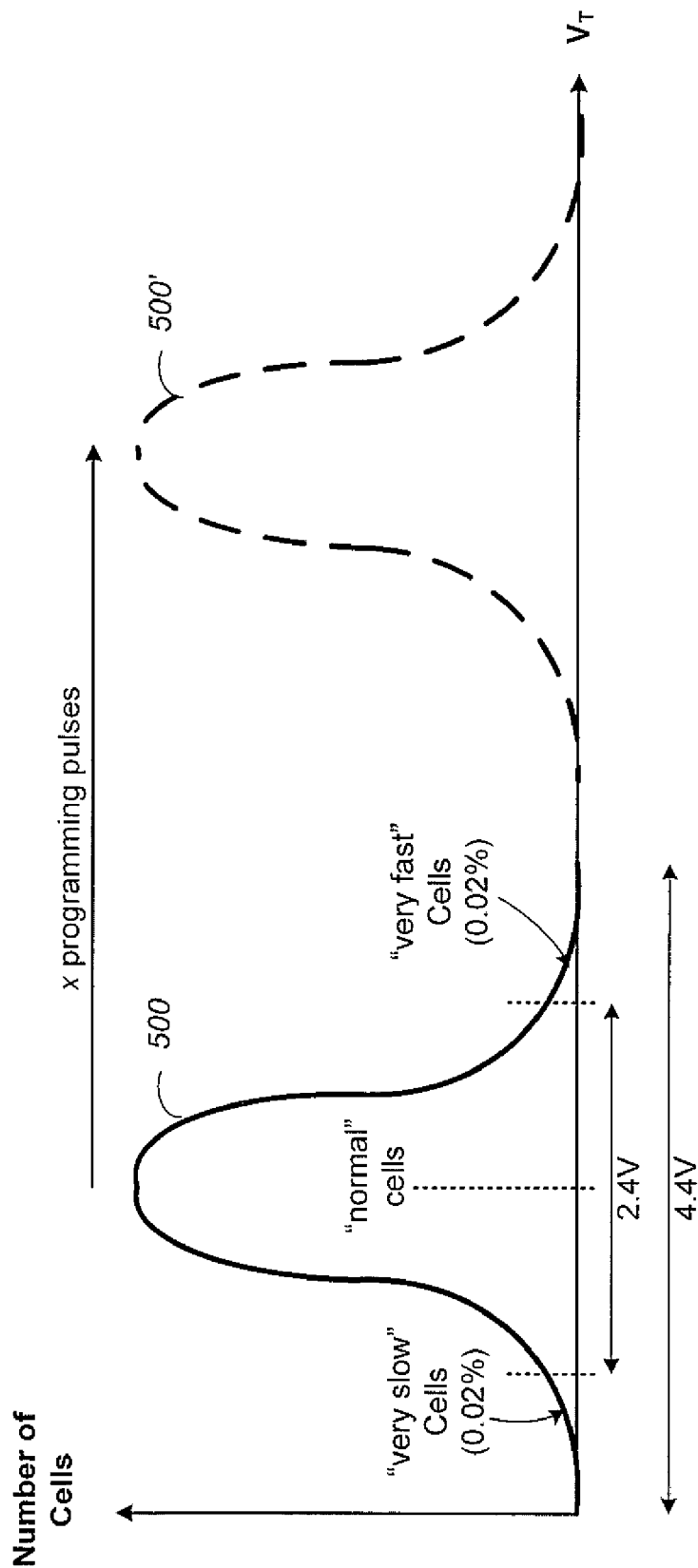
FIG. 14 illustrates an example of the programming characteristics of a population of memory cells.

FIG. 14 illustrates an example of the programming characteristics of a population of memory cells. As the population of memory cells gets programmed, the distribution of the threshold voltages programmed into the memory cells generally follows a normal distribution 500. In general, if all the cells are being programmed by a series of incremental programming voltage pulses, the whole normal distribution will shift to higher threshold values pulse by pulse. Of course in practice user data are programmed into the population of memory cells and as each cell is programmed to its target, it is locked out (i.e., inhibited from further programming.) In general the population is isolated into a number of subgroup distributions, each representing one of the memory states as shown previously in FIG. 9 and FIG. 10.

In order to illustrate the programming characteristics of every cell (i.e., the whole population), FIG. 14 illustrates the situation when all the cells get programmed without being locked out into any one of the memory states. For example, as each pulse is applied to all the cells, the distribution 500 shifts pulse by pulse towards higher threshold values. After x number of pulses, the whole distribution 500 is shifted to a distribution 500'. Cells near the lower end of the distribution 500 have the lowest threshold voltages, which means these cells are slow to become programmed pass a given threshold level. Cells near the higher end of the distribution 500 have the highest threshold voltages, which means these cells are fast and among the first to become programmed pass the given threshold level.

In the example shown, the normal distribution 500 spans over a threshold voltage range of 4.4V. If the fastest 0.02% (between 3 and 4 standard deviations) of the population corresponding to the upper fringe of the distribution and the slowest 0.02% of the population corresponding to the lower fringe of the distribution are excluded, then the rest of the population would only cover a reduced span, such as, for example, 2.4V. Thus for example, if each programming pulse has a strength that shifts the threshold voltage of each memory cell by 0.2V, it would take 22 pulses to sweep the entire distribution past a given threshold level. Generally, after each pulse a verify operation is performed which would involve multiple sensing of the different memory states. On the other hand, if the upper fringe which spans over 1V is ignored, there will be a saving of not having to verify over 5 pulses. Similar, if the lower fringe is ignored, there will be another saving of not having to verify over another 5 pulses. If both fringes are ignored, there will be a saving of not having to verify over 10 pulses out of a total of 22 pulses.

The cells in the outer fringes are subject to programming but without the benefit of verifying and may therefore become over-programmed past their targets. If errors arise due to over-programming, these fast cells (e.g., 0.02% of the population) are easily correctable by an error correction code ("ECC"), which is typically designed to correct from 4% to 10% of the population. In an example page with 16 k cells, where each cell may store 4 bits, each page will store a total of 64 k bits. Thus, the bits that will be ignored on either fringes (about 0.02% to 0.03%) will amount to roughly 15 bits per page.

A method of reducing program verify by taking into account the threshold distribution is disclosed in U.S. patent application Ser. No. 11/694,992, "DYNAMIC VERIFY BASED ON THRESHOLD VOLTAGE DISTRIBUTION" filed on 31 Mar. 2007 by Nima Mokhlesi and assigned to the same assignee as the present application. The entire disclosure of the above-mentioned application is incorporated herein by reference. A scheme of ignoring the outer fringes of the threshold distribution of a cell population is disclosed. Before the cells are programmed to their target states, the span of the threshold distribution is first determined by a dedicated, preliminary soft-programming pass. Once the characteristics of the distribution is determined by the preliminary soft-programming pass it can then be used to configure an optimum program/verify series for subsequent programming passes that actually program the cells to their respective targets. For example, the span for a subsequent programming pass is characterized by a starting programming pulse level and an ending programming pulse level based on the characteristics of the determined distribution.

The erased cells of the page generally have a distribution of threshold levels below a designated erase level. In a soft-programming pass, an incrementing series of programming voltage pulses is applied step by step, with a verify operation after each step to program the erased cells to a tighter distribution between the erase level and an offset level below. During the first, soft-programming pass, the starting programming pulse level for subsequent passes is given by when the first n cells (upper fringe population) have been soft-programmed. Also, the ending programming pulse level is given by when all except m number of cells (lower fringe population) are soft-programmed. Based on these two programming voltage pulse levels, the span of the threshold distribution is characterized (See FIG. 17 of Mokhlesi.) Subsequent programming passes that actually program the cells to their targets will each have a pulse series that starts and ends with these two voltage pulse levels respectively. Starting at the first determined programming voltage pulse level basically assumes that the first n fast programming cells may become over programmed as their verifying are delayed, but saves on starting from the lowest pulse level and all the intervening verifying steps. Any resultant errors will be corrected by ECC. Similarly, ending at the second determined programming voltage pulse prematurely assumes possibly m cells are not quite programmed to their target states, but reduces the total number of pulses and their accompanying verifying steps. Any resultant errors will be corrected by ECC.

The programming method of Mokhlesi helps to reduce the number of verify operations but before the memory cells could be programmed, a preliminary programming pass dedicated to discovering the characteristics of the threshold distribution must first be performed. This preliminary pass is an addition programming pass that does nothing towards programming each cell to its target state.

According to a general aspect of the present invention, as a programming pass alternately programs, verifies and inhibits programming of verified cells in order to program a group of memory cells in parallel to their respective target levels, a threshold distribution of the group is estimated on-the-fly. The estimated distribution allows a predetermined fringe population of fastest and slowest programming bits of the group to be ignored during verifying to save time. This is accomplished by using the estimated distribution to schedule the starting point of each subsequent verify level in order to reduce the total number of verify operations. Any resultant errors resulting from the fringe bits being ignored are correctable by an error correction code ("ECC".)

According to a preferred embodiment of the invention, wherein the threshold voltage of each memory cell is programmable to a value corresponding to a respective target among a set of memory states, a method of programming a group of memory cells in parallel in a programming pass including alternately programming with an incremented pulse and verifying until a predetermined initial number of memory cells have reached a first programmed memory state, wherein at which point a baseline programming pulse level is established and used in the rest of the programming pass to schedule after what additional pulses to begin verifying at which of the verify levels among a set thereof to demarcate between memory states.

Figure 15:
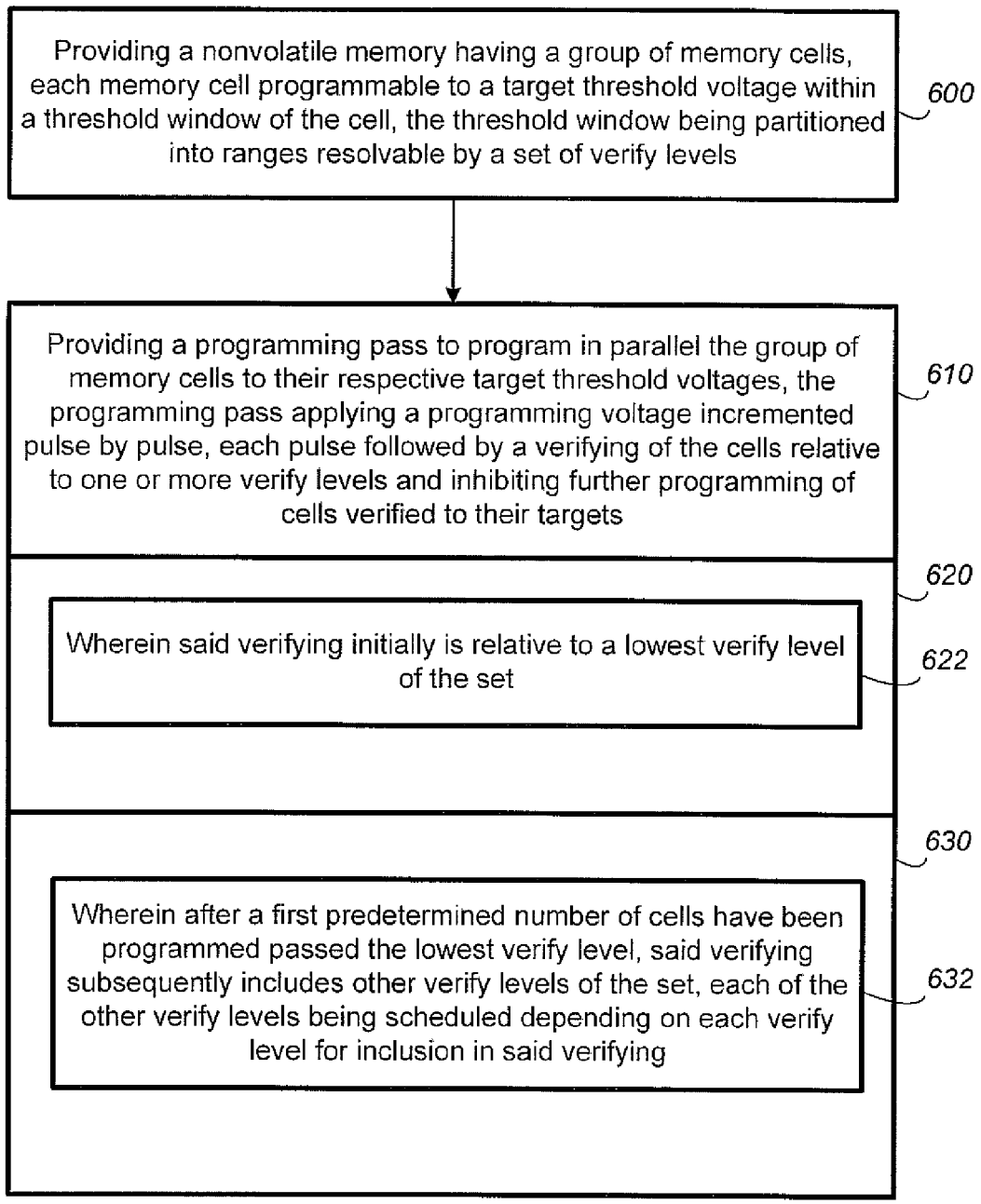
FIG. 15 is a flow diagram illustrating a programming method with reduced verify, according to a preferred embodiment of the invention.

FIG. 15 is a flow diagram illustrating a programming method with reduced verify, according to a preferred embodiment of the invention.
  STEP 600: Providing a nonvolatile memory having a group of memory cells, each memory cell programmable to a target threshold voltage within a threshold window of the cell, the threshold window being partitioned into ranges resolvable by a set of verify levels.
  STEP 610: Providing a programming pass to program in parallel the group of memory cells to their respective target threshold voltages, the programming pass applying a programming voltage incremented pulse by pulse, each pulse followed by a verifying of the cells relative to one or more verify levels and inhibiting further programming of cells verified to their targets.
  The STEP 610 essentially includes two phases respectively as in STEP 620 followed by STEP 630. STEP 620 includes STEP 622 and STEP 630 includes STEP 632.
  STEP 620 including STEP 622: Wherein said verifying initially is relative to a lowest verify level of the set.
  STEP 630 including STEP 632: Wherein after a first predetermined number of cells have been programmed passed the lowest verify level, said verifying subsequently includes other verify levels of the set, each of the other verify levels being scheduled depending on each verify level for inclusion in said verifying.

Thus, the lowest verify level, e.g., the first verify level among a set used to determined between the memory states in the threshold window, is used to identify the fastest cells as to when (i.e., at which pulse) they get programmed past the lowest verify level. As the programming proceeds pulse by pulse, the verifying will include different verify level, depending on the verify level itself.

It will be seen that one advantage of the present scheme is that no preliminary soft-programming pass is necessary. The fastest programming cells in the distribution are determined in the same programming pass used to program the cells to their respective targets. The delayed starting of various verify levels relative to the programming of these fastest cells helps to reduce the total number verify operations.

Figure 16:
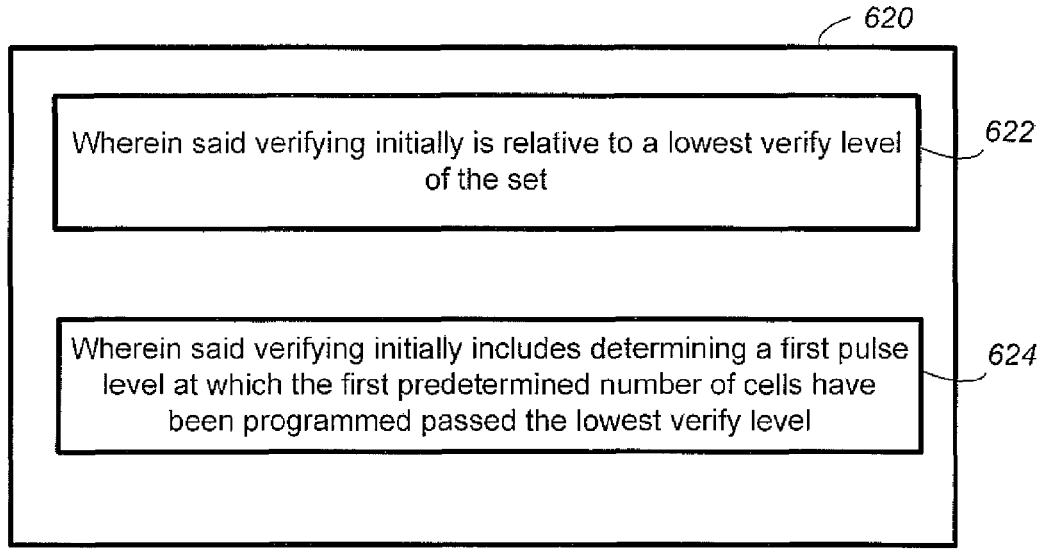
FIG. 16 is a flow diagram illustrating a more specific embodiment of STEP 620 shown in FIG. 15.

FIG. 16 is a flow diagram illustrating a more specific embodiment of STEP 620 shown in FIG. 15. STEP 620 includes STEP 622 as before and STEP 624.
  STEP 622: Wherein said verifying initially is relative to a lowest verify level of the set.
  STEP 624: Wherein said verifying initially includes determining a first pulse level at which the first predetermined number of cells have been programmed passed the lowest verify level.

Figure 17:
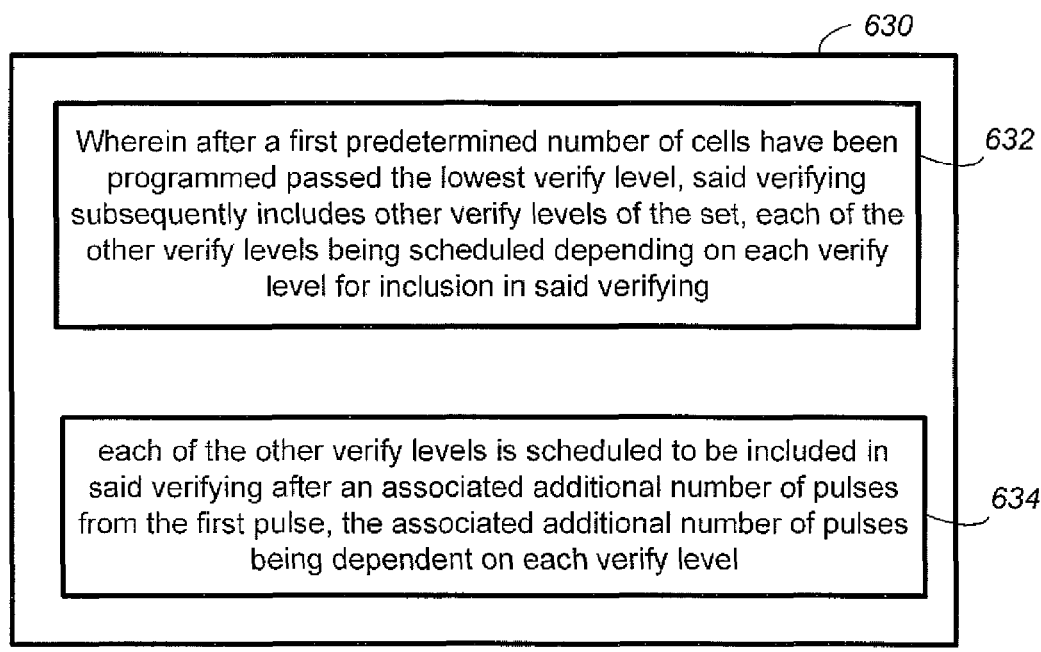
FIG. 17 is a flow diagram illustrating a more specific embodiment of STEP 630 shown in FIG. 15.

FIG. 17 is a flow diagram illustrating a more specific embodiment of STEP 630 shown in FIG. 15. STEP 630 includes STEP 632 as before and STEP 634.
  STEP 632: Wherein after a first predetermined number of cells have been programmed passed the lowest verify level, said verifying subsequently includes other verify levels of the set, each of the other verify levels being scheduled depending on each verify level for inclusion in said verifying.
  STEP 634: each of the other verify levels is scheduled to be included in said verifying after an associated additional number of pulses from the first pulse, the associated additional number of pulses being dependent on each verify level.

Figure 18:
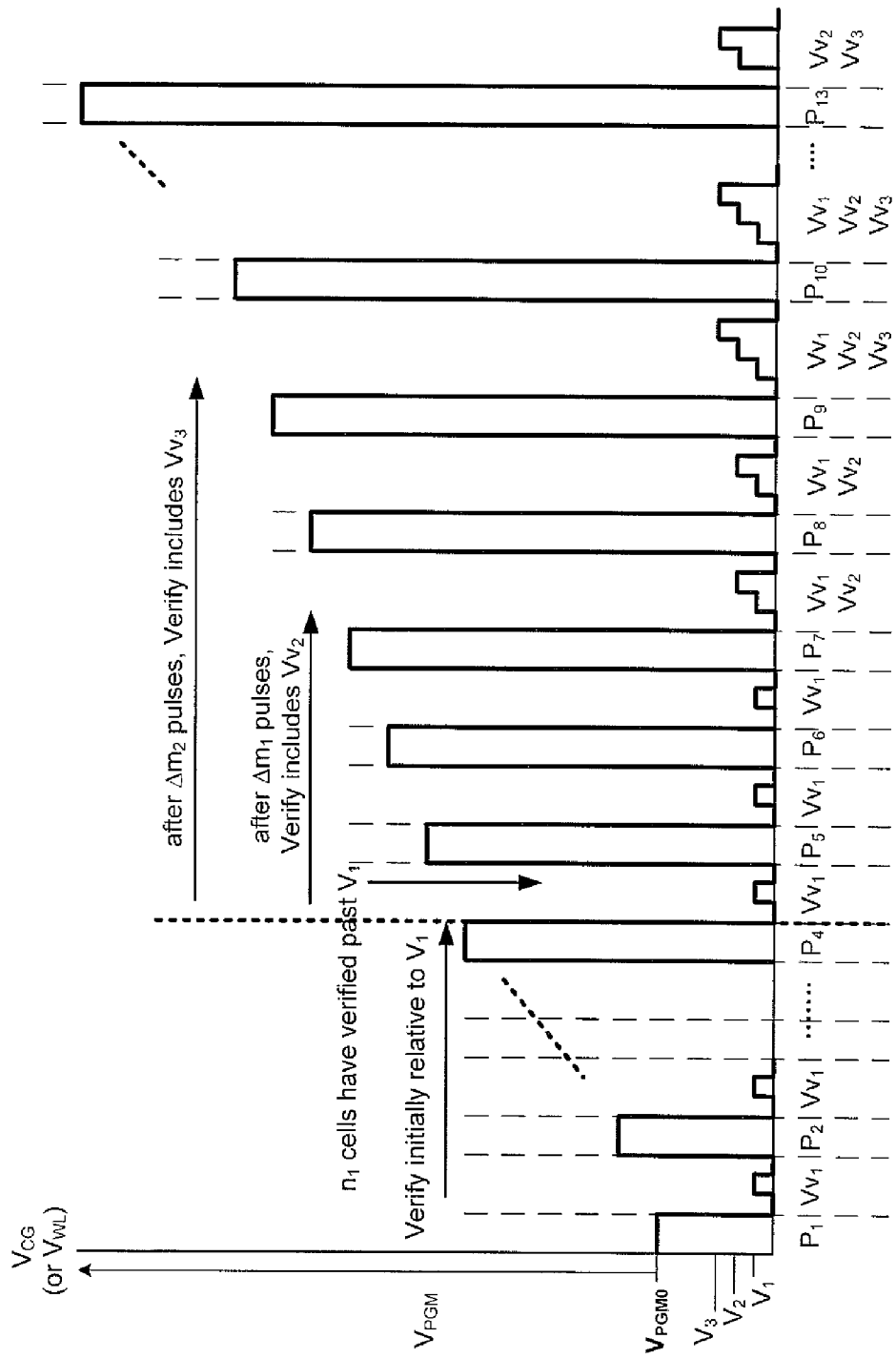
FIG. 18 illustrates schematically a timing diagram for a programming pass on a 4-state memory according to the invention.

FIG. 18 illustrates schematically a timing diagram for a programming pass on a 4-state memory according to the invention. As shown previously in FIG. 9, a 4-state memory has its threshold window partitioned into four partitions, resolvable by verify levels, $V_1$, $V_2$ and $V_3$. The four partitions correspond to one erased state and three progressively more programmed states. As with STEP 610, each programming pulse is followed by a verifying. The verifying may include one or more of the verify levels such as combinations of one or more of $V_1$, $V_2$ and $V_3$.

In the example, the programming pass starts with the program pulse $P_1$ and ends with $P_{13}$. The first pulse $P_1$ has an initial programming voltage $V_{PGM0}$ that is applied to the word line of the group of cell to be programming in parallel. Programming pulses $P_1$ to $P_4$ are applied during the first phase (STEP 620), where the verifying after each pulse as denoted by $Vv_1$ is only relative to verify level $V_1$.

After each verifying, a page scan is performed among the cells in the group to determine which cell has programmed past $V_1$. When $n_1$ cells have been detected to pass $V_1$, the current pulse number is established as a first pulse that allows $n_1$ cells of the population to reach the verify level $V_1$. This provides a reference point from which to schedule verifying to include the higher verify levels such as $V_2$ and $V_3$.

The target state of each cells is usually stored in the data latch unless overwritten when the cell is locked out from further programming. During the page scan, the target state of each cell is taken into account with whether the cell has been programmed past a certain verify level. In this example, by pulse $P_4$, a predetermined number such as $n_1$ of cells have been detected to have programmed passed the verify level $V_1$. If some of these $n_1$ cells are targeted to the first program state, those cells will be programmed inhibited (locked out) and they will not be over-programmed. However, during $P_1$ to $P_4$, the rest among the $n_1$ that are targeted beyond the first programmed state are not locked out at verify level $V_1$. While the first phase of verifying at verify level $V_1$ is going on, these fast cells targeted to higher states are not subject to the verifying and lockout process beyond $V_1$ and therefore are likely to be over-programmed. The errors resulting from these cells will be corrected by an ECC code.

After establishing the location of the first reference pulse, the programming pass continues as in STEP 610 and enters into the second phase (STEP 630) where $V_2$ will also be included in the verifying at some pulse number later. Similarly, after another few pulses, $V_3$ will also be included in the verifying. Depending on the pulse step size, the increase in programmed threshold due to each pulse step can be estimated. In general, an additional number of pulses $\Delta m$ is expected to shift the programmed threshold $\Delta V$ by approximately $dV/dm \cdot \Delta m$.

For example, it takes $\Delta m_1$ (e.g., 3) pulses to move from the verify level $V_1$ to the next verify level $V_2$ and it takes $\Delta m_2$ (e.g., 5) pulses to move from the verify level $V_1$ to the verify level $V_3$. Referring to FIG. 18, it is shown that after the first reference pulse is established at $P_4$, verifying is only relative to the verify level $V_1$. Three pulses ($\Delta m_1$) after $P_4$ at $P_7$, the verifying also include $V_2$. Similarly, five pulses ($\Delta m_2$) after $P_4$ at $P_9$, the verifying also include $V_3$.

The page scan after each verify will also indicate if all the cells have been verified or if a certain verify level is no longer needed. For example, if the page scan finds that all the cells targeted to the first programmed state have all been verified and locked out, there will be no need to include verify level $V_1$ in subsequent verifying. In that case, the verifying will exclude the verify level no longer needed. The page scan will eventually indicate that all cells have been verified. If so, the programming pass is done and will terminate.

It can be seen that the programming method essentially ignores the fast bits and delay the verifying of the higher verify levels, thereby saving time.

Figure 19A:
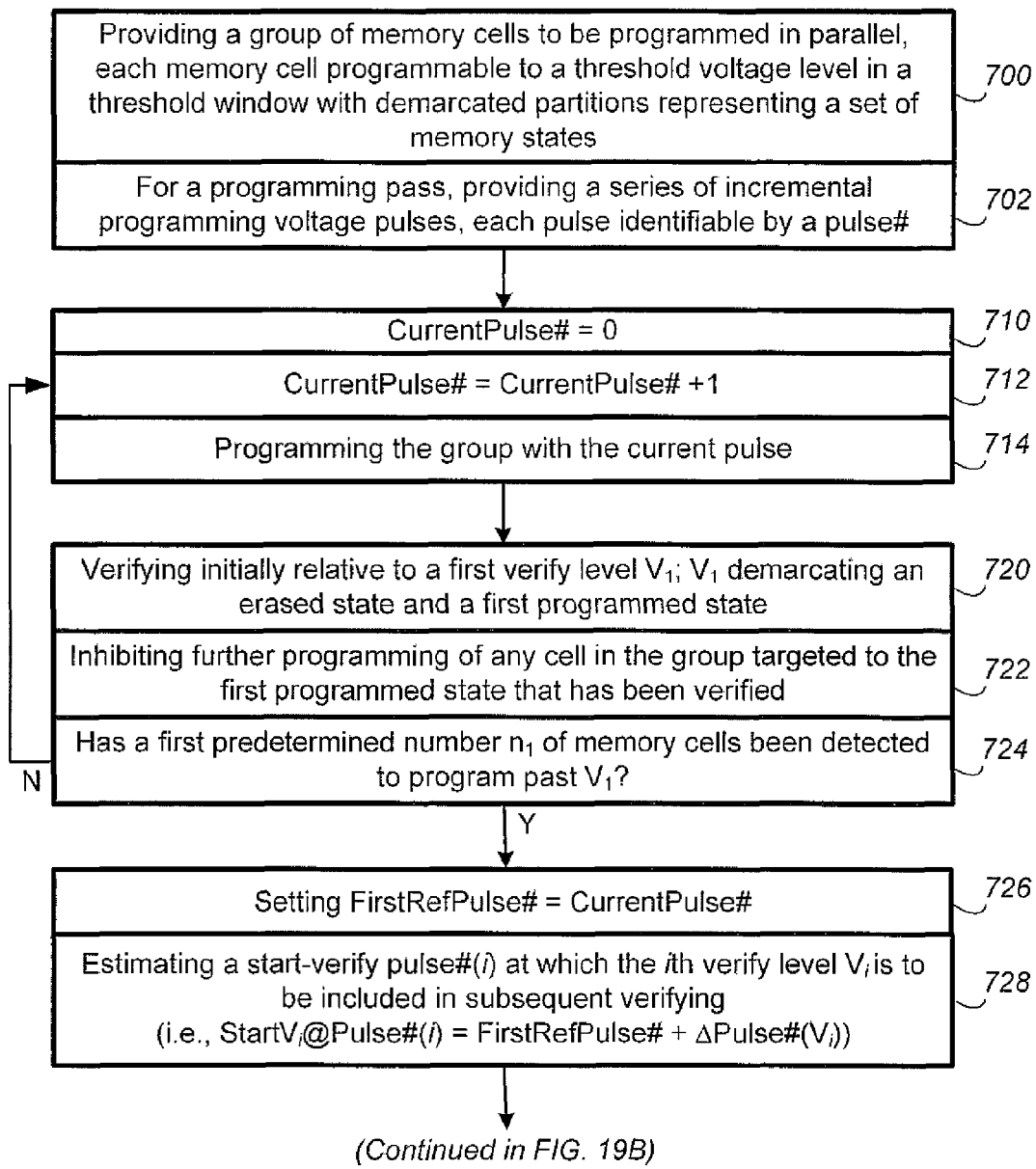
FIG. 19 is a flow diagram illustrating the programming method of FIG. 15, according to a more specific, preferred embodiment of the invention.
Figure 19B:
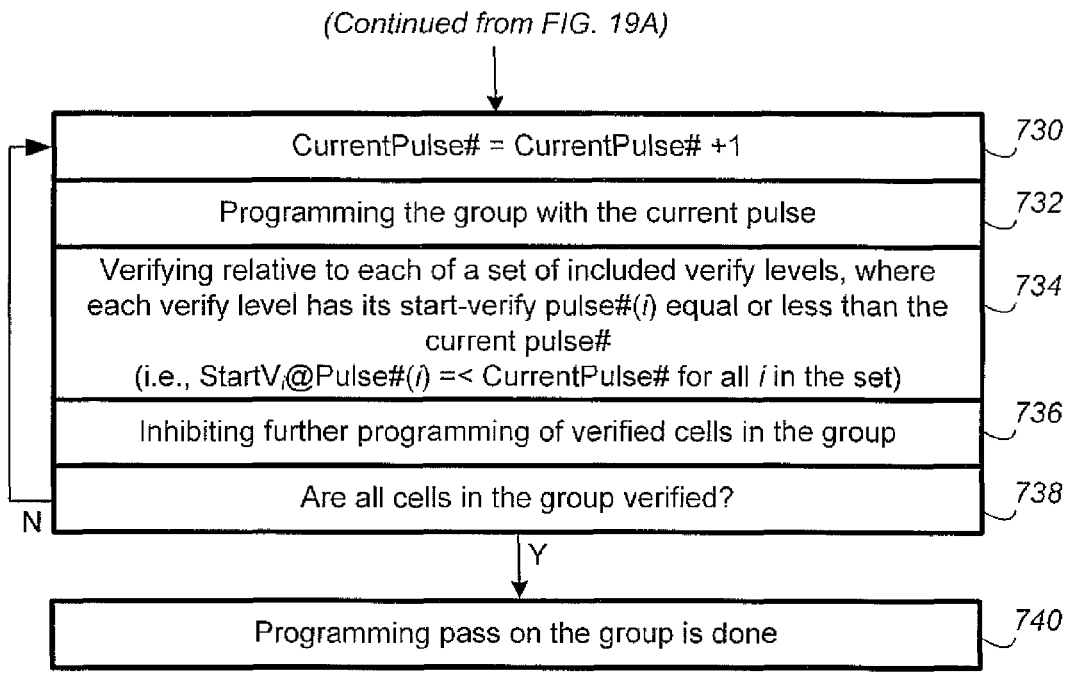

FIG. 19 is a flow diagram illustrating the programming method of FIG. 15, according to a more specific, preferred embodiment of the invention.

STEP 700: Providing a group of memory cells to be programmed in parallel, each memory cell programmable to a threshold voltage level in a threshold window with demarcated partitions representing a set of memory states.

STEP 702: For a programming pass, providing a series of incremental programming voltage pulses, each pulse identifiable by a pulse #.

STEP 710: Initializing: CurrentPulse #=0.

STEP 712: Incrementing Current Pulse # by 1: CurrentPulse #=CurrentPulse #+1.

STEP 714: Programming the group with the current pulse.

STEP 720: Verifying initially relative to a first verify level ($V_1$), where $V_1$ demarcating an erased state and a first programmed state.

STEP 722: Inhibiting further programming of any cell in the group targeted to the first programmed state that has been verified.

STEP 724: Has a first predetermined number $n_1$ of memory cells been detected to program past $V_1$? If TRUE, proceeding to STEP 726, otherwise returning to STEP 712.

STEP 726: Setting FirstRefPulse#=CurrentPulse#.

STEP 728: Estimating a start-verify pulse#(i) at which the ith demacation level Vi is to be included in subsequent verifying, (i.e., StartVi@Pulse#(i)=FirstRefPulse#+DPulse#(Vi))

STEP 730: Incrementing Current Pulse# by 1: CurrentPulse#=CurrentPulse#+1.

STEP 732: Programming the group with the current pulse.

STEP 734: Verifying relative to each of a set of included verify levels, where each verify level has its start-verify pulse# (i) equal to or less than the current pulse# (i.e., StartVi@Pulse#(i)=<CurrentPulse# for all i in the set)

STEP 736: Inhibiting further programming of verified cells in the group.

STEP 738: Are all cells in the group verified? If TRUE, proceeding to STEP 740, otherwise returning to STEP 730.

STEP 740: Programming pass on the group is done.

According to a preferred embodiment of the invention, wherein the threshold voltage of each memory cell is programmable to a value corresponding to a respective target among a set of memory states, a method of programming a group of memory cells in parallel in a programming pass including alternately programming with an incremented pulse and verifying relative to one or more verify levels, wherein for each verify level relative to which a second predetermined number of cells remain to be verified, the second predetermined number of cells are not verified but treated as if verified relative to that verify level.

In this way, the slowest bits from the distribution of the group of memory cells are not verified and treated as if verified. This results in saving in the verifying. Any errors resulting from these unverified cells are corrected by the error correction code.

Figure 20:
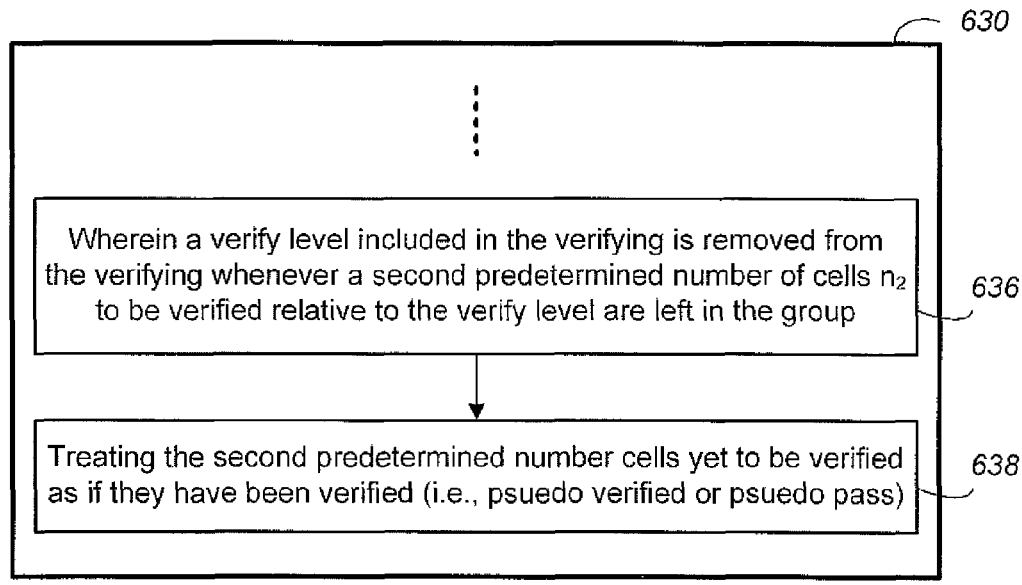
FIG. 20 is a flow diagram illustrating additional steps to handle the slowest bits in the programming method illustrated in FIG. 15 and FIG. 17.

FIG. 20 is a flow diagram illustrating additional steps to handle the slowest bits in the programming method illustrated in FIG. 15 and FIG. 17. STEP 630 is the second phase of the verifying after the first reference pulse number has been established. The additional steps to handle the slowest bits are incorporated as part of STEP 630. Preferably included in STEP 630 are STEP 636 and STEP 638.

STEP 636: Wherein a verify level included in the verifying is removed from the verifying whenever a second predetermined number of cells n2 to be verified relative to the verify level are left in the group.

STEP 638: Treating the second predetermined number cells yet to be verified as if they have been verified (i.e., psuedo verified or psuedo pass).

Figure 21A:
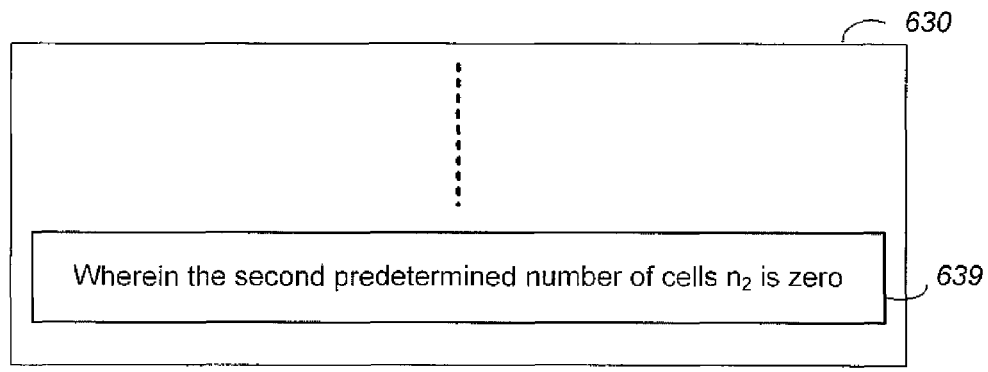
FIG. 21A is a flow diagram illustrating a particular instance of the number remaining bit for each verify level to be ignored in STEP 630 shown in FIG. 20.

FIG. 21A is a flow diagram illustrating a particular instance of the number remaining bit for each verify level to be ignored in STEP 630 shown in FIG. 20.

STEP 639: Wherein the second predetermined number of cells $n_2$ is zero.

In this embodiment, essentially all the slowest bits are verified. There will be no saving in the verifying.

Figure 21B:
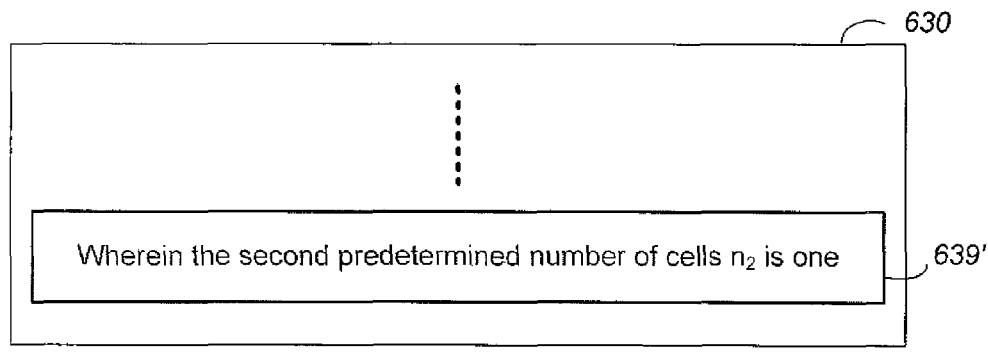
FIG. 21B is a flow diagram illustrating yet another particular instance of the number remaining bit for each verify level to be ignored in STEP 630 shown in FIG. 20.

FIG. 21B is a flow diagram illustrating yet another particular instance of the number remaining bit for each verify level to be ignored in STEP 630 shown in FIG. 20.

STEP 639': Wherein the second predetermined number of cells n2 is one.

In this embodiment, for each verify level, the last bit left is not verified and treated as if verified. This will save one or more additional pulses and verifying.

According to another aspect of the invention, wherein the threshold voltage of each memory cell is programmable to a value corresponding to a respective target among a set of memory states, a method of programming a group of memory cells in parallel in a programming pass including alternately programming with an incremented pulse and verifying relative to one or more verify levels, wherein for each verify level relative to which a second predetermined number of cells remain to be verified, the second predetermined number of cells are not verified but treated as if verified relative to that verify level. The cell that is treated as if verified is given a predetermined number of additional programming pulses without the intervening verifying or inhibiting steps.

Figure 22:
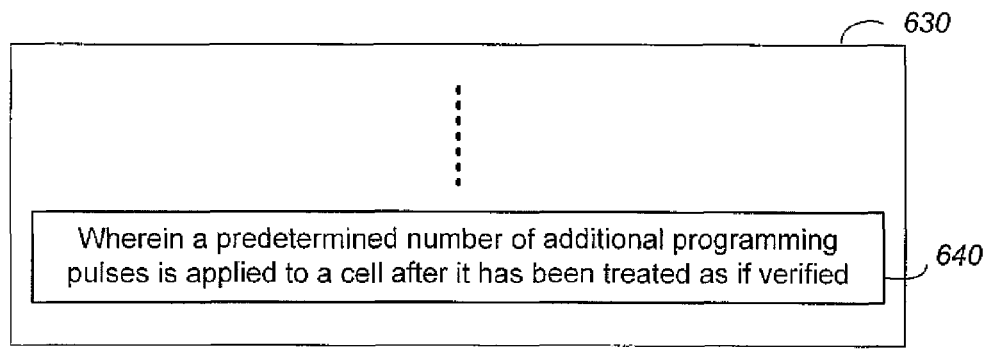
FIG. 22 is a flow diagram illustrating another aspect of the invention where an additional predetermined number of pulses are applied to the number remaining bit for each verify level to be ignored in STEP 630 shown in FIG. 20.

FIG. 22 is a flow diagram illustrating another aspect of the invention where an additional predetermined number of pulses are applied to the number remaining bit for each verify level to be ignored in STEP 630 shown in FIG. 20.

STEP 640: Wherein a predetermined number of additional programming pulses are applied to a cell after it has been treated as if verified.

In one preferred embodiment, the predetermined number of additional programming pulses is one. In this way, for these slowest bits which were not verified, an additional pulse will help to program them closer towards their targets.

All patents, patent applications, articles, books, specifications, other publications, documents and things referenced herein are hereby incorporated herein by this reference in their entirety for all purposes. To the extent of any inconsistency or conflict in the definition or use of a term between any of the incorporated publications, documents or things and the text of the present document, the definition or use of the term in the present document shall prevail.

Although the various aspects of the present invention have been described with respect to certain embodiments, it is understood that the invention is entitled to protection within the full scope of the appended claims.

It is claimed:

1. In a nonvolatile memory having a group of memory cells, each memory cell programmable to a target threshold voltage within a threshold window of the cell, the threshold window being partitioned into ranges resolvable by a set of verify levels, a method of programming the group of memory cells, comprising:

providing a programming pass to program in parallel the group of memory cells to their respective target threshold voltages, the programming pass applying a programming voltage incremented pulse by pulse, each pulse followed by a verifying of the cells relative to one or more verify levels and inhibiting further programming of cells verified to their targets; and wherein:

said verifying initially is relative to a lowest verify level of the set; and after a first predetermined number of cells have been programmed passed the lowest verify level, said verifying subsequently includes other verify levels of the set, each of the other verify levels being scheduled depending on each verify level for inclusion in said verifying.

2. The method as in claim 1, wherein:

the lowest verify level distinguishes an erased state from a first programmed memory state.

3. The method as in claim 1, wherein:

the first predetermined number of cells is 0.02% of a population of cells formed by the group of memory cells.

4. The method as in claim 1, wherein:

said verifying initially includes determining a first pulse level at which the first predetermined number of cells have been programmed passed the lowest verify level; and each of the other verify levels is scheduled to be included in said verifying after an associated additional number of pulses from the first pulse, the associated additional number of pulses being dependent on each verify level.

5. The method as in claim 4, wherein:

the number of associated additional number of pulses is also dependent on a size step between two adjacent pulses.

6. The method as in claim 1, wherein:

the number of associated additional number of pulses for a given verify level is a predetermined margin plus a number of pulses estimated to program the memory cell from the lowest verify level to the given verify level.

7. The method as in claim 6, wherein:

the predetermined margin is at least two pulses.

8. The method as in claim 1, further comprising:

providing an error correction code for correcting errors arising from said programming method.

9. The method as in claim 1, wherein:

said verifying excludes verifying relative to a given verify level whenever the group of memory cells still under programming no longer requires verifying relative to the given verify level.

10. The method as in claim 1, wherein:

for each verify level of the set relative to which a second predetermined number of cells remains to be verified, the second predetermined number of cells are not verified but treated as if verified relative to that verify level.

11. The method as in claim 10, wherein:

the second predetermined number of cells is one.

12. The method as in claim 10, wherein:

a predetermined number of additional programming pulses is applied to a cell after it has been treated as if verified.

13. The method as in claim 10, wherein:

the predetermined number of additional programming pulses is one.

14. A nonvolatile memory, comprising:

a group of memory cells, each memory cell programmable to a target threshold voltage within a threshold window of the cell, the threshold window being partitioned into ranges resolvable by a set of verify levels, a method of programming the group of memory cells, comprising:

circuits for programming, verifying and inhibiting to program in parallel the group of memory cells to their respective target threshold voltages in a programming pass, the programming pass applying a programming voltage incremented pulse by pulse, each pulse followed by a verifying of the cells relative to one or more verify levels and inhibiting further programming of cells verified to their targets; and wherein:

said verifying initially is relative to a lowest verify level of the set; and after a first predetermined number of cells have been programmed passed the lowest verify level, said verifying subsequently includes other verify levels of the set, each of the other verify levels being scheduled depending on each verify level for inclusion in said verifying.

15. The nonvolatile memory as in claim 14, wherein:
the lowest verify level distinguishes an erased state from a first programmed memory state.

16. The nonvolatile memory as in claim 14, wherein:
the first predetermined number of cells is 0.02% of a population of cells formed by the group of memory cells.

17. The nonvolatile memory as in claim 14, wherein:
said verifying initially includes determining a first pulse level at which the first predetermined number of cells have been programmed passed the lowest verify level; and each of the other verify levels is scheduled to be included in said verifying after an associated additional number of pulses from the first pulse, the associated additional number of pulses being dependent on each verify level.

18. The nonvolatile memory as in claim 17, wherein:
the number of associated additional number of pulses is also dependent on a size step between two adjacent pulses.

19. The nonvolatile memory as in claim 14, wherein:
the number of associated additional number of pulses for a given verify level is a predetermined margin plus a number of pulses estimated to program the memory cell from the lowest verify level to the given verify level.

20. The nonvolatile memory as in claim 19, wherein:
the predetermined margin is at least two pulses.

21. The nonvolatile memory as in claim 14, further comprising:
providing an error correction code for correcting errors arising from said programming method.

22. The nonvolatile memory as in claim 14, wherein:
said verifying excludes verifying relative to a given verify level whenever the group of memory cells still under programming no longer requires verifying relative to the given verify level.

23. The nonvolatile memory as in claim 14, wherein:
for each verify level of the set relative to which a second predetermined number of cells remains to be verified, the second predetermined number of cells are not verified but treated as if verified relative to that verify level.

24. The nonvolatile memory as in claim 23, wherein:
the second predetermined number of cells is one.

25. The nonvolatile memory as in claim 23, wherein:
a predetermined number of additional programming pulses is applied to a cell after it has been treated as if verified.

26. The nonvolatile memory as in claim 23, wherein:
the predetermined number of additional programming pulses is one.

* * * * *